(12) United States Patent
Abel

(10) Patent No.: US 12,494,375 B2
(45) Date of Patent: Dec. 9, 2025

(54) METHOD TO SELECTIVELY ETCH SILICON NITRIDE TO SILICON OXIDE USING SURFACE ALKYLATION

(71) Applicant: Tokyo Electron Limited, Tokyo (JP)

(72) Inventor: Paul Abel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 293 days.

(21) Appl. No.: 18/240,069

(22) Filed: Aug. 30, 2023

(65) Prior Publication Data
US 2025/0079181 A1     Mar. 6, 2025

(51) Int. Cl.
*H01L 21/311*     (2006.01)

(52) U.S. Cl.
CPC ... *H01L 21/31111* (2013.01); *H01L 21/31116* (2013.01)

(58) Field of Classification Search
CPC ............... H01L 21/31111; H01L 21/31116
See application file for complete search history.

(56) References Cited

U.S. PATENT DOCUMENTS

| | | | |
|---|---|---|---|
| RE44,292 E | | 6/2013 | Oshima |
| 8,778,210 B2 | | 7/2014 | Cooper et al. |
| 9,779,956 B1 | | 10/2017 | Zhang et al. |
| 9,911,620 B2 | | 3/2018 | Zhu et al. |
| 10,079,154 B1 | | 9/2018 | Le et al. |
| 10,651,045 B2 | | 5/2020 | Cooper et al. |
| 10,985,014 B2 * | | 4/2021 | Saly .................... H01L 21/0228 |
| 2012/0264308 A1 * | | 10/2012 | Watanabe ......... H01L 21/31111 156/345.17 |
| 2016/0196969 A1 * | | 7/2016 | Berry, III .......... H01L 21/02252 438/694 |
| 2018/0166255 A1 * | | 6/2018 | Blomberg ................. C23F 4/02 |
| 2019/0237339 A1 | | 8/2019 | Bassett et al. |
| 2019/0367811 A1 | | 12/2019 | Lee et al. |

(Continued)

FOREIGN PATENT DOCUMENTS

KR     20150048221     5/2015

OTHER PUBLICATIONS

International Search Report and The Written Opinion, PCT/US2024/035107; Oct. 11, 2024, 9 pgs.

(Continued)

*Primary Examiner* — Anita K Alanko
(74) *Attorney, Agent, or Firm* — Egan, Enders & Huston LLP.

(57) ABSTRACT

Embodiments of processes and methods that provide selective etching of silicon nitride are disclosed herein. More specifically, new processes, methods and etch chemistries are provided to selectively etch silicon nitride layers formed on a substrate, while protecting silicon oxide layers formed on the same substrate. In the method embodiments, a substrate having a silicon nitride (SiN) layer and a silicon oxide layer formed on the same substrate is exposed to an alkylating agent, which reacts with the amine groups on the exposed SiN surfaces to form an alkylated surface layer on the SiN layer. The substrate is exposed to a fluorinating agent to remove the alkylated surface layer and selectively etch the SiN layer without significantly etching the silicon oxide layer. The disclosed methods can be used to selectively etch silicon nitride over silicon oxide using a wet or dry process.

14 Claims, 10 Drawing Sheets

(56) References Cited

U.S. PATENT DOCUMENTS

| | | |
|---|---|---|
| 2019/0390110 A1 | 12/2019 | Kim et al. |
| 2022/0254646 A1* | 8/2022 | Faguet .............. H01L 21/32134 |
| 2025/0079182 A1* | 3/2025 | Dezelah ................. H01L 21/32 |
| 2025/0179626 A1* | 6/2025 | Yeon ................... C23C 16/0272 |
| 2025/0293039 A1* | 9/2025 | Levtchin ........... H01L 21/31111 |

OTHER PUBLICATIONS

Tsai et al., "Method To Selectively Etch Silicon Nitride To Silicon Oxide Using Water Crystallization", U.S. Appl. No. 17/967,996, filed Oct. 18, 2022, 34 pgs.

Knotter et al., "Etching Mechanism Of Silicon Nitride In HF-Based Solutions", Journal Of The Electrochemical Society, Jan. 2021, 5 pgs.

\* cited by examiner

METHOD TO SELECTIVELY ETCH SILICON NITRIDE TO SILICON OXIDE USING SURFACE ALKYLATION

BACKGROUND

The present disclosure relates to the processing of substrates, and in particular, to methods to etch material layers on a semiconductor substrate.

Semiconductor device formation typically involves a series of manufacturing techniques related to the formation, patterning, and removal of a number of layers of material on a substrate. During routine semiconductor fabrication, various materials formed on a substrate may be removed by patterned etching, chemical-mechanical polishing, as well as other techniques. A variety of techniques are known for etching layers on a substrate, including plasma-based or vapor-phase etching (otherwise referred to as dry etching) and liquid based etching (otherwise referred to as wet etching). As the semiconductor device size is decreased to sub-nanoscale, and device integration is changed from two dimensional to three dimensional structures, more precise and selective etch technology is required for semiconductor device fabrication.

Silicon nitride (SiN) is used in a wide variety of semiconductor devices as a barrier layer for dopant diffusion, a gate sidewall spacer layer, a buffer layer, a liner layer, an etch stop layer, a sacrificial layer, etc. due to its high insulating characteristics, high thermal and mechanical stability, etc. Because SiN layers are commonly formed on substrates having silicon (Si) and/or silicon oxide ($SiO_2$) layers disposed thereon, selective etching of silicon nitride over silicon and/or silicon oxide is important for various microelectronic applications.

A variety of techniques have been used to etch silicon nitride. For example, fluorocarbon (e.g., $C_xF_z$-based), hydrofluorocarbon (e.g., $C_xH_yF_z$-based) and other fluorine (e.g., $NF_x$-based) etch chemistries have been used to etch silicon nitride selective to oxide, silicon and other materials. For example, $C_xH_yF_z/O_2/H_2$ plasmas have been used to create thicker depositions on SiN and $CF_4/O_2/N_2$ plasmas have been used to enhance nitrogen elimination in SiN layers. However, it is difficult to fine tune the deposition layer thickness and oxide layers are still etched during this etch process. Moreover, fluorocarbon ($C_xF_z$) etch gases are often undesirable due to contamination issues by carbon or deposition of $CF_x$ ($CH_x$) polymers on the surface of the film, which is a detrimental factor for device fabrication.

Other techniques have used a two-step approach—surface modification followed by removal of the modified surface layers—to selectively etch silicon nitride. For example, one two-step process for the selective etch of silicon nitride uses a hydrogen plasma to modify exposed SiN surfaces and a dilute hydrofluoric acid (dHF) wet etch to remove the modified surface layer. This two-step process uses a dry etch technique for surface modification and a wet etch technique for removal of the modified surface layer, and as such, cannot be implemented as a cyclical process in high volume manufacturing. Another two-step process used to selectively etch silicon nitride in a cyclic dry etch process uses a hydrogen plasma to modify exposed SiN surfaces and a fluorinated plasma to remove the modified surface layer. This two-step dry etch process is typically performed in a plasma processing chamber (e.g., an inductively coupled plasma, ICP, or capacitively coupled, CCP, process chamber) at relatively low pressure (e.g., 10-100 mTorr) and moderate to high temperature (e.g., 10° C.-100° C.) to selectively etch SiN in a cyclic process.

FIG. 1 illustrates one example of a conventional dry etch process 10 that can be used to etch silicon nitride on a substrate having a silicon nitride (SiN) layer and a silicon oxide (SiOx such as, e.g., $SiO_2$) layer exposed on the substrate. The dry etch process 10 shown in FIG. 1 is cyclic, two-step dry etch process that generally includes a surface modification step (Step 1) followed by a removal step (Step 2).

During the surface modification step (Step 1), the dry etch process 10 generates a hydrogen plasma 12 within the plasma processing chamber and exposes a substrate having a silicon nitride (SiN) layer 14 and a silicon oxide (SiOx) layer 16 (e.g., $SiO_2$) formed thereon to the hydrogen plasma 12. When the substrate is exposed to the hydrogen plasma 12, hydrogen ions within the hydrogen plasma 12: (a) react with exposed SiN surfaces to create Si—H and N—H bonds on the exposed SiN surfaces, and (b) react with exposed silicon oxide surfaces to remove oxygen (O) atoms from the exposed SiOx surfaces. The reaction between the hydrogen ions and the exposed SiN surfaces modifies the exposed SiN surfaces, leaving a first modified layer 15 (e.g., a hydrogenated silicon nitride (H—SiN) layer) on the unmodified SiN layer 14, and produces a first reaction byproduct (e.g., ammonia, $NH_3$). The reaction between the hydrogen ions and the exposed SiOx surfaces modifies the exposed SiOx surfaces, leaving a second modified layer 17 (e.g., an Si layer) on the unmodified SiOx layer 16, and produces a second reaction byproduct (e.g., water, $H_2O$).

During the removal step (Step 2), the dry etch process 10 generates a fluorinated plasma 18 (e.g., an anhydrous HF plasma) within the plasma processing chamber. When the substrate is exposed to the fluorinated plasma 18, hydrogen and fluorine ions within the fluorinated plasma 18 react with the silicon (Si) atoms in the first modified layer 15 and the second modified layer 17 to produce a third reaction byproduct (e.g., silicon tetrafluoride, $SiF_4$), which is vaporized at the reaction temperature to etch the SiN layer 14 and the SiOx layer 16. The dry etch process 10 may be repeated N cycles to etch the SiN layer 14.

The dry etch process 10 shown in FIG. 1 can achieve partial selectivity of silicon nitride (SiN) over silicon oxide (SiOx) by adjusting various etch conditions to favor the removal of SiN over SiOx. For example, while vapor phase etching of SiOx surfaces with an anhydrous HF plasma requires relatively high temperatures, SiN surfaces can be etched using substantially lower temperatures. Thus, partial selectivity of SiN over SiOx can be achieved in the dry etch process 10 by performing the removal step at lower temperatures than would be required to etch SiOx.

However, the dry etch process 10 shown in FIG. 1 cannot achieve high selectivity of SiN over SiOx even when a low temperature, anhydrous HF plasma is used during the removal step. While anhydrous HF vapor shows good etch selectivity for SiN, the reaction byproducts (for example, $NH_3$ and $H_2O$) produced during the surface modification step catalytically activate the HF vapor etch of SiOx, thereby reducing the selectivity between SiN and SiOx and etching both the SiN layer 14 and the SiOx layer 16, as shown in FIG. 1.

Although selective etch processes for silicon nitride are known, the etch selectivity of silicon nitride (SiN) over silicon oxide (SiOx such as, e.g., $SiO_2$) needs further improvement in current semiconductor fabrication processes. A highly selective etch of silicon nitride to silicon oxide is critical in many semiconductor fabrication processes. As such, improved techniques are needed to protect silicon oxide layers (as well as structures below such oxide layers) from over-etch when etching silicon nitride on a substrate having both silicon nitride and silicon oxide layers formed thereon.

SUMMARY

Embodiments of improved processes and methods that provide selective etching of silicon nitride are disclosed herein. In the disclosed embodiments, new processes, methods and etch chemistries are used to selectively etch silicon nitride layers formed on a substrate, while protecting silicon oxide layers formed on the same substrate.

The processes and methods disclosed herein achieve selective etching of silicon nitride over silicon oxide by exposing the substrate to an alkylating agent and a fluorinating agent in a wet or dry etch process. In the embodiments disclosed herein, a substrate having a silicon nitride (SiN) layer and a silicon oxide layer (e.g., a $SiO_2$ layer) formed on the same substrate is exposed to an alkylating agent, which reacts with the amine surface groups on the exposed SiN surfaces to alkylate the amine surface groups and form an alkylated surface layer on the SiN layer. The substrate is further exposed to a fluorinating agent to remove the alkylated surface layer and selectively etch the SiN layer without significantly etching the $SiO_2$ layer. In some embodiments, the processes and methods disclosed herein may provide a $SiN:SiO_2$ etch selectivity greater than 15:1.

The processes and methods disclosed herein utilize a variety of new etch chemistries to achieve selective etching of silicon nitride over silicon oxide in both wet and dry etch processes. As described in more detail below, the new etch chemistries disclosed herein may be provided to the substrate in: (a) a solution phase during a wet atomic layer etching (ALE) process, or (b) a vapor phase during a chemical vapor etching (CVE) process. In some embodiments, the processes and methods disclosed herein may achieve a silicon nitride to silicon oxide etch selectivity greater than 15:1.

According to one embodiment, a method is provided herein for selectively etching silicon nitride over silicon oxide using a wet atomic layer etching (ALE) process. The method may generally include receiving a substrate having a silicon nitride layer and a silicon oxide layer exposed on a surface of the substrate, and selectively etching the silicon nitride layer by performing multiple cycles of the wet ALE process, where each cycle of the wet ALE process includes: (a) exposing the surface of the substrate to a first etch solution comprising an alkylating agent, which chemically modifies an exposed surface of the silicon nitride layer to form an alkylated surface layer on the silicon nitride layer, wherein the alkylated surface layer is self-limited and insoluble in the first etch solution; (b) removing the first etch solution from the surface of the substrate subsequent to forming the alkylated surface layer; (c) exposing the surface of the substrate to a second etch solution comprising fluorine ions in a solvent, wherein the fluorine ions react with the alkylated surface layer to form soluble species that are dissolved by the solvent; and (d) removing the second etch solution and the soluble species from the substrate to selectively etch the silicon nitride layer without etching the silicon oxide layer. In some embodiments, steps (a)-(d) may be repeated for one or more cycles until a predetermined amount of the silicon nitride layer is selectively etched.

When the surface of the substrate is exposed to the first etch solution (in step (a)), the alkylating agent may react with amine groups on the exposed surface of the silicon nitride layer to form alkylamine groups on the exposed surface of the silicon nitride layer. This also has the effect of increasing the polarization of the silicon-nitrogen (Si—N) bonds on the exposed surface of the silicon nitride layer. The alkylated surface layer may comprise a wide variety of alkylamine groups, as discussed further in more detail below. A wide variety of alkylating agents may be used within the first etch solution. In some embodiments, the alkylating agent included within the first etch solution may be an alkyl halide (for example, a bromide, chloride or other halide of a hydrocarbon). In some embodiments, the alkyl halide may be ethyl bromide or methyl bromide. In one example embodiment, the first etch solution may be: (a) pure ethyl bromide, or (b) a dilute solution of ethyl bromide dissolved in water, alcohol or another organic solvent. It is noted, however, that the first etch solution is not strictly limited to ethyl bromide solutions and may include other alkyl halides in aqueous or non-aqueous solutions.

When the surface of the substrate is exposed to the second etch solution (in step (c)), a rate limiting etch reaction occurs between the fluorine ions and the alkylated surface layer. This rate limiting etch reaction occurs under conditions that etch the alkylated surface layer, but not the silicon oxide layer. In aqueous solution, this can be accomplished by increasing the pH above where the silicon oxide etch readily occurs. In non-aqueous solution, this can be accomplished by controlling the speciation of fluoride to prevent the formation of reactive species (e.g., $HF_2^-$ ions) that etch the silicon oxide layer. A wide variety of fluorinating agents may be used within the second etch solution. Regardless of the fluorinating agent used, the second etch solution is preferably one which: (a) preferentially reacts with alkylamine surface groups over amine groups on the silicon nitride layer, and (b) does not form reactive species capable of etching the silicon oxide layer.

In some embodiments, second etch solution may include a fluoride salt dissolved in a non-aqueous solvent. Examples of fluoride salts that may be included within the second etch solution include, but are not limited to, quaternary ammonium fluoride salts (such as, e.g., tetramethylammonium fluoride, benzyl trimethylammonium fluoride, etc.), quaternary phosphonium salts (such as, e.g., tetramethylphosphonium fluoride, tetraphenylphosphonium fluoride, etc.), heterocyclic fluoride salts (such as, e.g., 1,3-dimethylimidazolium fluoride, 1-methylpyridinium fluoride, etc.) and hexamethylenetetramine fluoride salts (such as, e.g., 1-methylhexamethylenetetramine fluoride, etc.). When a fluoride salt is used in the second etch solution, the fluoride salt provides the fluorine ions that react with the alkylated surface layer to form the soluble species that are dissolved by the non-aqueous solvent. Examples of non-aqueous solvents that may be included within the second etch solution include, but are not limited to, dimethyl sulfoxide (($CH_3$)$_2SO$), dimethylformamide (($CH_3$)$_2NCH$), tetrahydrofuran (($CH_2$)$_4O$), acetonitrile ($CH_3CN$), an alcohol (such as, e.g., methanol, ethanol, IPA, etc.), a polyol (such as, e.g., glycerol, glycols), an ether (such as, e.g., diethyl ether) or a chlorocarbon (such as, e.g., dichloromethanes). Although examples are provided, one skilled in the art would understand how other fluoride salts and non-aqueous solvents not specifically mentioned herein may also be used in the second etch solution.

In other embodiments, the second etch solution may be a buffered HF solution comprising hydrofluoric acid (HF), a fluoride salt buffering agent such as ammonium fluoride ($NH_4F$) and a base dissolved in an aqueous solvent. The base may be a quaternary ammonium hydroxide (such as, e.g., ammonium hydroxide ($NH_4OH$), tetramethylammonium hydroxide (TMAH, $C_4H_{13}NO$)), a mineral base (such as, e.g., sodium hydroxide (NaOH)) or a trialkyl amine (such as, e.g., triethylamine). When the second etch solution includes HF, a buffering agent and a base, both HF and the buffering agent provide the fluorine ions that react with the alkylated surface layer to form the soluble species that are dissolved by the aqueous solvent. The base is used to inhibit etching of the silicon oxide layer by increasing the overall pH of the second etch solution. In solution at low pH, HF partially dissociates to form ions including but not limited to $H^+$, $F^-$, and $HF_2^-$ in solution. The $HF_2^-$ ion is the species that is primarily responsible for etching silicon oxides. Its formation, as well as the etch of silicon oxides, is suppressed at high pH.

According to another embodiment, another method is provided herein for selectively etching silicon nitride over silicon oxide using a chemical vapor etch (CVE) process. The method may generally include: (a) receiving a substrate having a silicon nitride layer and a silicon oxide layer exposed on a surface of the substrate, (b) exposing the surface of the substrate to a vapor-phase alkylating agent, which reacts with an exposed surface of the silicon nitride layer to alkylate the amine groups on the exposed surface of the silicon nitride layer and form an alkylated surface layer on the silicon nitride layer; and (c) exposing the surface of the substrate to a vapor-phase fluorinating agent to remove the alkylated surface layer and selectively etch the silicon nitride layer without etching the silicon oxide layer. By exposing the surface of the substrate to the vapor-phase alkylating agent (in step (b)), the method converts the amine groups on the exposed surface of the silicon nitride layer to alkylamine groups and reduces or prevents formation of a gas-phase reaction byproduct (e.g., $NH_3$), which is capable of catalyzing etching of the silicon oxide layer, when the surface of the substrate is exposed to the vapor-phase fluorinating agent (in step (c)).

A wide variety of vapor-phase alkylating agents and vapor-phase fluorinating agents may be used in the method described above. For example, the vapor-phase alkylating agent may be a first process gas containing an alkyl halide, such as an ethyl bromide (EtBr) or methyl bromide vapor, and the vapor-phase fluorinating agent may be a second process gas containing fluorine atoms. In one embodiment, the second process gas may comprise a hydrofluoric acid (HF) vapor; however, other types of process gases containing fluorine atoms reactive with the alkylated surface layer may also be used. For example, the second process gas may include difluoride ($F_2$), xenon difluoride ($XeF_2$) or nitrogen trifluoride ($NF_3$) in addition or alternative to HF.

In some embodiments of the method, the surface of the substrate may be exposed to the vapor-phase alkylating agent (in step (b)) and the vapor-phase fluorinating agent (in step (c)) sequentially with no overlap in time. In such embodiments, the surface of the substrate may be exposed to the vapor-phase alkylating agent to form alkylamine groups on the exposed surface of the silicon nitride layer. When the substrate is subsequently exposed to the vapor-phase fluorinating agent, fluorine atoms within the vapor-phase fluorinating agent may react with the alkylamine groups to produce reaction byproducts, which are vaporized from the exposed surface of the silicon nitride layer to selectively remove the alkylated surface layer from the silicon nitride layer. The removal of the alkylated surface layer is non-limiting in this embodiment. As such, the surface of the substrate may be exposed to the vapor-phase fluorinating agent (in step (c)) for an amount of time that is sufficient to remove the alkylated surface layer without: (a) etching the silicon nitride layer underlying the alkylated surface layer, or (b) forming a gas-phase reaction byproduct (e.g., $NH_3$) capable of catalyzing etching of the silicon oxide layer. In some embodiments, steps (b) and (c) may be repeated one or more times to repeatedly form and remove an alkylated surface layer on the silicon nitride layer to selectively etch a predetermined amount of the silicon nitride layer.

In other embodiments of the method, the surface of the substrate may be exposed to the vapor-phase alkylating agent (in step (b)) and the vapor-phase fluorinating agent (in step (c)) concurrently with at least some overlap in time. In such embodiments, the vapor-phase alkylating agent may react with the amine groups on the exposed surface of the silicon nitride layer to form alkylamine groups, and the vapor-phase fluorinating agent may react with the alkylamine groups to produce reaction byproducts, which are vaporized from the exposed surface of the silicon nitride layer to selectively remove the alkylated surface layer from the silicon nitride layer. The vapor-phase fluorinating agent may also react with the exposed surface of the silicon nitride layer to form a gas-phase reaction byproduct (e.g., $NH_3$), which is capable of catalyzing etching of the silicon oxide layer. In such embodiments, the vapor-phase alkylating agent may react with the gas-phase reaction byproduct to form an alkyl amine (e.g., $Et_3N$) gas. This gas phase reaction reduces the concentration of the gas-phase reaction byproduct (e.g., $NH_3$) to prevent etching of the silicon oxide layer.

As noted above and described further herein, the present disclosure provides various embodiments of methods that utilize new etch chemistries for selectively etching silicon nitride over silicon oxide in both wet and dry etch processes. Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this Summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

The present disclosure provides various embodiments of improved processes and methods that provide selective etching of silicon nitride (SiN). More specifically, the present disclosure provides new etch processes, methods and chemistries to selectively etch silicon nitride layers formed on a substrate, while protecting oxide layers (e.g., silicon dioxide ($SiO_2$) and other oxide layers) formed on the same substrate.

Silicon nitride is often used in the fabrication of integrated circuits, for example, as a sacrificial layer. After patterning, the silicon nitride layer needs to be selectively removed while leaving other materials on the wafer surface. Selective removal of silicon nitride in the presence of oxides (such as, but not limited to, $SiO_2$) is especially challenging.

Figure 1:
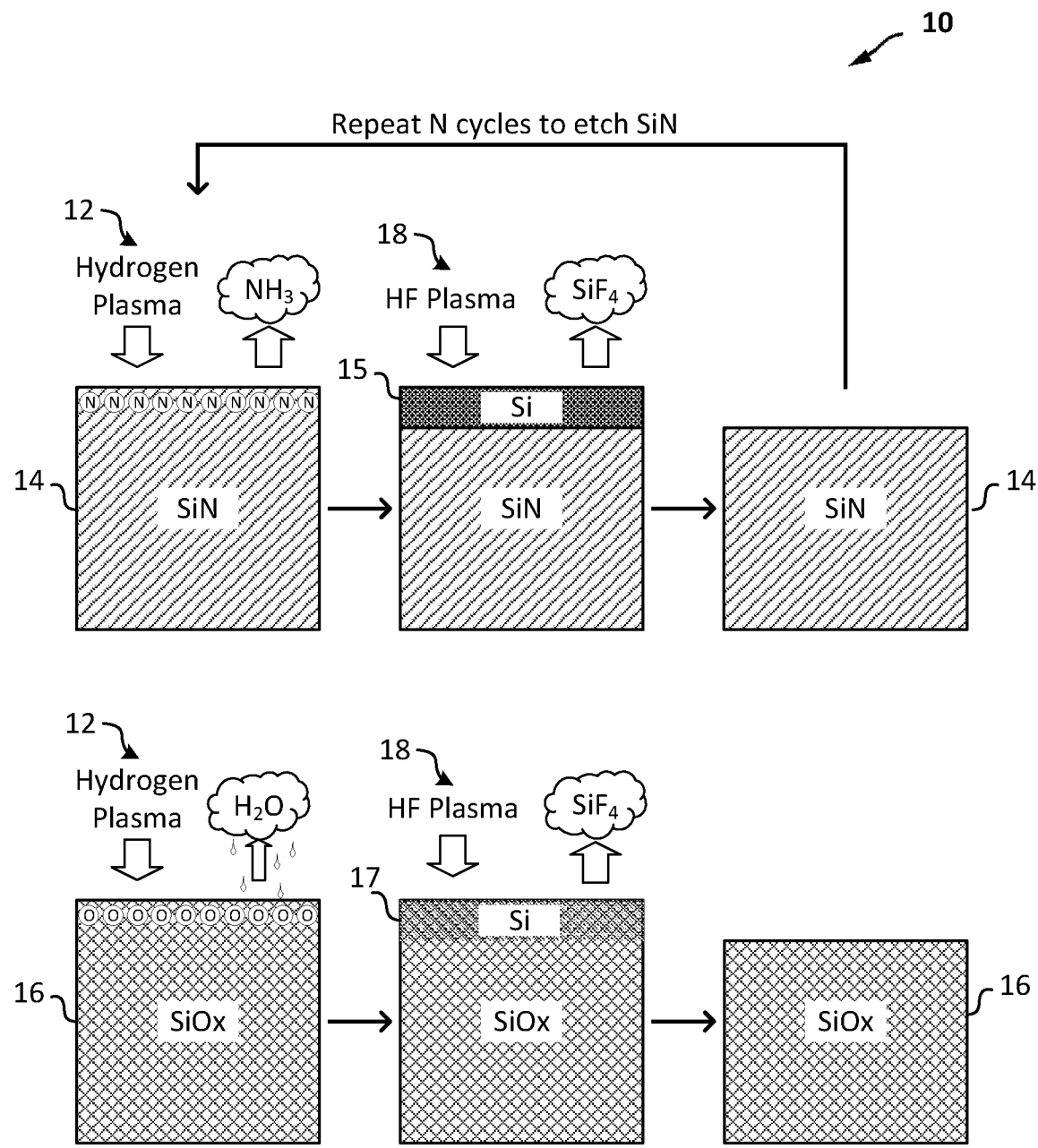
FIG. 1 is a process flow diagram of a cyclic, two-step dry etch process that uses a hydrogen plasma in a surface modification step followed by a fluorinated plasma in a removal step to etch silicon nitride over silicon oxide.

Hydrofluoric acid (HF) is commonly used to etch both silicon nitride and silicon dioxide in various wet and dry etch processes. As noted above in reference to FIG. 1, conventional etch processes attempt to improve selectivity to silicon nitride by adjusting the etch conditions (e.g., the process temperature) to favor the removal of silicon nitride over silicon dioxide. However, any selectivity achieved through this method is achieved through kinetics, rather than thermodynamically preventing the etch of one of these materials. This is true when hydrofluoric acid is used in the vapor phase and solution phase to etch silicon nitride in the presence of silicon dioxide (and other oxides). As further noted above in reference to FIG. 1, conventional etch processes produce reaction byproducts (e.g., $NH_3$ and $H_2O$), which catalyze the etch of silicon dioxide and limits the selectivity that can be achieved.

Figure 2A:
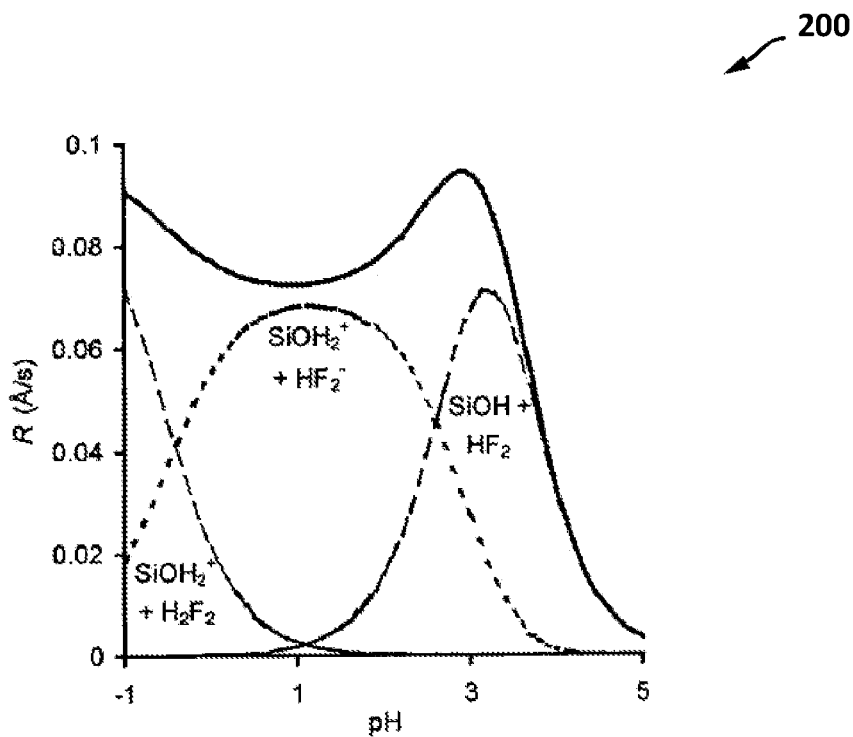
FIG. 2A is a graph illustrating contributions to the total etch rate (R, expressed in angstroms per second, Å/s) from ions derived from hydrofluoric acid (HF) species when etching silicon dioxide ($SiO_2$).
Figure 2B:
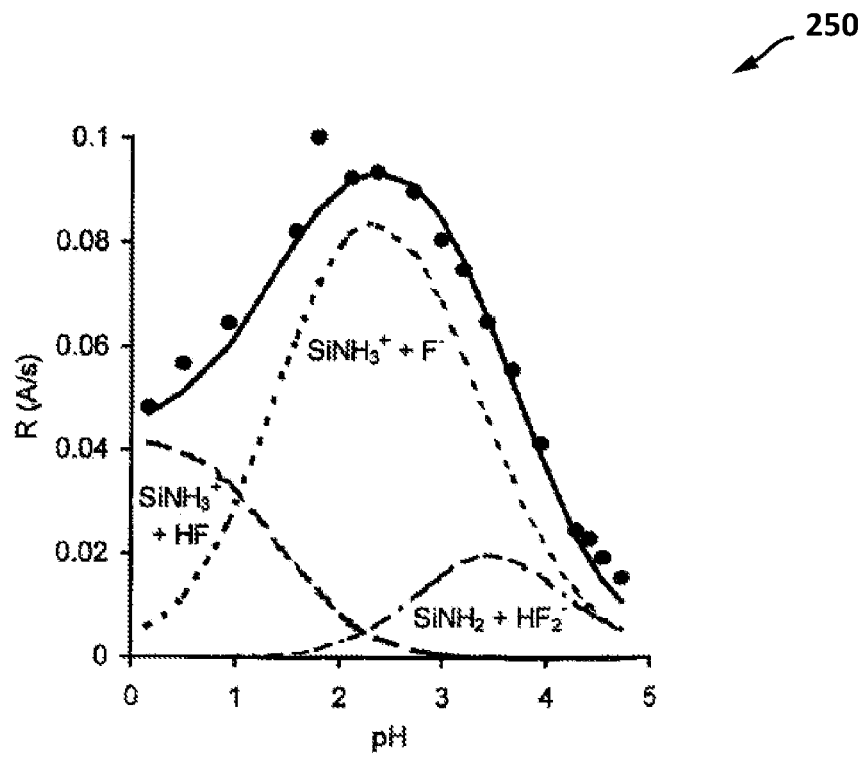
FIG. 2B is a graph illustrating contributions to the total etch rate (R, expressed in Å/s) from ions derived from hydrofluoric acid (HF) species when etching silicon nitride (SiN).

FIGS. 2A and 2B show contributions to the total etch rate (R, expressed in angstroms per second, Å/s) from ions derived from hydrofluoric acid species (e.g., HF, $H_2F_2$, $HF_2^-$ and F– ions) when etching silicon dioxide (FIG. 2A) and silicon nitride (FIG. 2B). The graphs depicted in FIGS. 2A and 2B show that, while HF can be used to etch both silicon nitride (SiN) and silicon dioxide ($SiO_2$), the mechanisms are quite different. For example, the graph 200 depicted in FIG. 2A shows that the $HF_2^-$ ion is the main ion species responsible for driving the $SiO_2$ etch. However, the F– ion is the main ion species responsible for etching SiN, as shown in graph 250 of FIG. 2B. As such, the graphs shown in FIGS. 2A and 2B indicate that etch selectivity of SiN over $SiO_2$ can be improved by controlling ion speciation in the HF etch chemistry to favor F– ions over $HF_2^-$ ions.

FIGS. 2A and 2B further show that, while HF and $HF_2^-$ ions attack both protonated and deprotonated surface groups on exposed SiN and $SiO_2$ surfaces, F– ions attack only the protonated Si—$NH_3^+$ surface groups (e.g., amine surface groups) on the exposed SiN surfaces. This suggests that a selective etch of SiN can be accomplished with HF etch chemistries, and other non-HF etch chemistries containing F– ions, as long as the silicon-nitrogen (Si—N) bonds to the amine surface groups can be appropriately polarized.

Polarization of the Si—N bonds is necessary to activate the SiN surface for etching. This polarization is typically achieved in conventional SiN etch processes by creating acidic conditions to protonate the amine surface groups on the exposed SiN surfaces. However, acidic conditions push speciation of HF to form $HF_2^-$ ions, which etches $SiO_2$ as shown in FIG. 2A. Some conventional SiN etch processes attempt to reduce $SiO_2$ etching by using pH adjustment or buffering in aqueous etch solutions to control the ion speciation in the HF etch chemistry. However, ion speciation cannot be controlled independently of surface group speciation using pH adjustment or buffering. As such, conventional SiN etch processes cannot achieve high selectivity when etching SiN layers in the presence of $SiO_2$ (and other oxides).

Unlike conventional SiN etch processes, which rely on acidic conditions to polarize the Si—N bonds and pH adjustment or buffering to control etch selectivity, the processes and methods disclosed herein use surface alkylation to polarize the Si—N bonds and achieve thermodynamic selectivity for etching silicon nitride through chemical modification of the silicon nitride surface. In the embodiments disclosed herein, a substrate having a silicon nitride (SiN) layer and a silicon oxide layer (e.g., a $SiO_2$ layer) formed on the same substrate is exposed to an alkylating agent, which reacts with the amine surface groups on the exposed SiN surfaces to protonate the amine surface groups and form an alkylated surface layer on the SiN layer. The substrate is further exposed to a fluorinating agent to remove the alkylated surface layer and selectively etch the SiN layer without significantly etching the $SiO_2$ layer. In some embodiments, the processes and methods disclosed herein may provide a $SiN:SiO_2$ etch selectivity that is greater than 15:1.

A wide variety of alkylating agents can be used in the present disclosure to polarize the Si—N bonds to the amine surface groups and form the alkylated surface layer on the SiN layer. For example, the alkylating agent may be an alkyl halide, such as ethyl bromide (EtBr, $CH_3CH_2Br$), methyl bromide ($CH_3Br$), or another bromide, chloride or other halide of a hydrocarbon. The alkylating agent may be provided to the substrate in a solution phase or vapor phase. In some embodiments, the alkylating agent may be included within a first etch solution comprising pure ethyl bromide, or a dilute solution of ethyl bromide dissolved in water, alcohol or another organic solvent. In other embodiments, the alkylating agent may be a process gas containing an alkyl halide (such as, but not limited to, vapor-phase EtBr).

Amine surface groups form on the surface of silicon nitride as a spontaneous method of passivating dangling bonds. Nitrogen atoms on the surface are undercoordinated, and the reaction to form amines is very thermodynamically favorable. They are formed spontaneously during deposition, or their formation can be promoted by post-deposition surface treatment. The amine surface groups formed on the SiN surface as a result of the deposition process or surface treatments may include NH surface groups, $NH_2$ surface groups, etc.

Alkyl halides are very reactive towards amines. When a SiN surface is exposed to an alkyl halide, the alkyl halide reacts with the amine surface groups on the exposed SiN surface to form alkylamine groups on the SiN surface, thus alkylating the SiN surface. The alkylation reaction does not stop with the formation of a primary alkylamine and may continue until tertiary amines are formed (if there is an excess of the alkyl halide reaction). In some cases, the alkylamine groups formed on the SiN surface may include a mix of monoalkyl silyl amines, dialkyl silyl amines, and trialkyl silyl ammonium salts. The distribution of alkylamine groups will be limited by the surface density of the amine groups on the initial SiN surface and steric hinderance based on the size of the alkyl group.

Figure 3A:
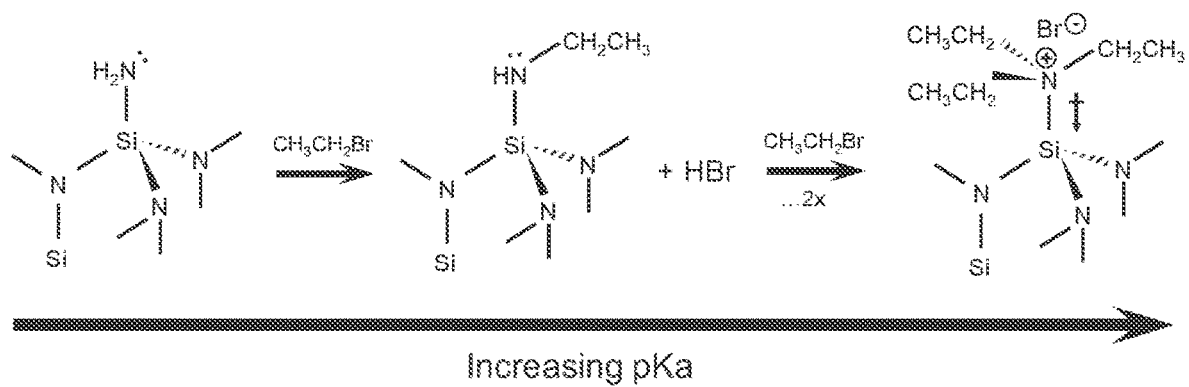
FIG. 3A illustrates an example alkylation reaction that may occur when a silicon nitride (SiN) surface is exposed to ethyl bromide (EtBr, $CH_3CH_2Br$).

FIG. 3A illustrates an example alkylation reaction that may occur when a SiN surface having amine surface groups (such as, e.g., $NH_2$) is exposed to ethyl bromide (EtBr, $CH_3CH_2Br$). As shown in FIG. 3A, ethyl bromide reacts with the amine surface groups on the exposed SiN surface to polarize the Si—N bonds and form alkylamine groups on the SiN surface, thus forming an alkylated surface layer on the SiN surface. The reaction between ethyl bromide and the amine surface groups may lead to the formation of one or more alkylamine groups on the SiN surface, including silyl-ethyl amine (Si-EtNH) groups, silyl-diethyl amine (Si-$(Et)_2NH$) groups and/or silyl-triethylammonium bromide salt (Si-$(Et)_3NBr$) groups. Although the polarization of the Si—N bonds is shown in FIG. 3A only for the terminal silyl-triethylammonium bromide salt (Si-$(Et)_3NBr$) species, the Si—N bonds will be polarized, although to a lesser degree, in the intermediate species as well.

A wide variety of fluorinating agents may also be used to remove the alkylated surface layer and selectively etch the SiN layer. Like the alkylating agent, the fluorinating agent may be provided to the substrate in a solution phase or vapor phase. In some embodiments, the fluorinating agent may be included within a second etch solution comprising a fluoride salt dissolved in a non-aqueous solvent, or a basic HF solution comprising hydrofluoric acid (HF), a fluoride salt buffering agent and a base dissolved in an aqueous solvent. In other embodiments, the fluorinating agent may be a process gas containing fluorine atoms (such as, but not limited to, vapor-phase HF).

When exposed to the fluorinating agent, the F– ions contained within the second etch solution (or the fluorine atoms contained with the process gas) attack the alkylamine groups on the exposed SiN surface to remove the alkylated surface layer and selectively etch the SiN layer without significantly etching the $SiO_2$ layer. During the etch, the Si—N bonds on the SiN surface are replaced with silicon-fluorine (Si—F) bonds. Although four Si—F bonds must be formed to remove one Si atom, the first Si—F bond is the hardest to form because it has a very high energy transition state. This first Si—F bond formation is referred to herein as the "rate limiting reaction." The equilibrium surface during the etch is mostly alkylamine terminated silicon, or alkylamine surface groups. When one of the alkylamine surface groups is replaced with an F atom, that silicon (Si) atom is quickly removed through additional fluorination. This exposes nitrogen (N) atoms on the underlying SiN surface. The newly exposed nitrogen atoms are converted to new amine surface groups through reactions with leftover hydrogen (H) atoms. The amine formation can either be concerted with silicon fluoride formation or sequential. For example, when hydrofluoric acid (HF) is used as the fluorinating agent, HF gives an F atom when it reacts to fluorinate a Si atom and leaves behind a reactive H atom, which binds with the nitrogen atom newly exposed by the etch process.

Figure 3B:
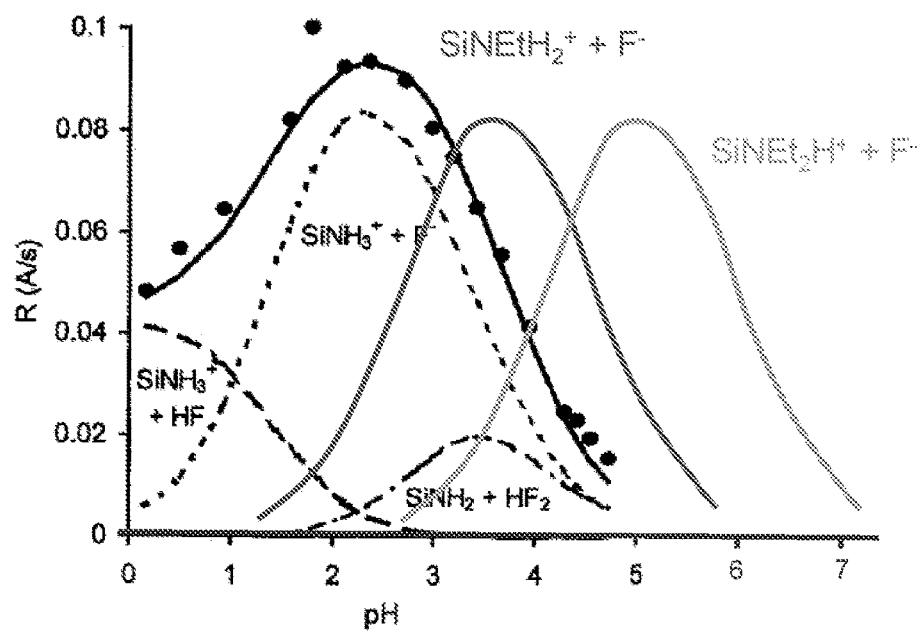
FIG. 3B is a graph illustrating contributions to the total etch rate (R, expressed in Å/s) from F– ion species derived from a fluorinating agent after alkylating the SiN surface with ethyl bromide.

FIG. 3B shows the contributions to the total etch rate (R, expressed in Å/s) from F– ion species derived from a fluorinating agent after alkylating the SiN surface with ethyl bromide (EtBr, $CH_3CH_2Br$). When the alkylated SiN surface is exposed to the fluorinating agent, the rate limiting etch reaction occurs at a higher pH (FIG. 3B) than would have occurred if the unmodified SiN surface were exposed to the fluorinating agent without alkylation (FIG. 2B). While sufficient for removing the alkylated surface layer and etching the SiN layer, the pH of the etch solution is too high to etch the $SiO_2$ layer. This suggests that thermodynamic selectivity for etching silicon nitride can be achieved through alkylation of the silicon nitride surface.

The processes and methods disclosed herein combine the use of an alkylating agent and a fluorinating agent to provide selective etching of silicon nitride over silicon oxides. As shown in FIGS. 3A-3B and described above, the alkylating agent polarizes the Si—N bonds and alkylates the SiN surface. The alkylation reaction increases the pKa of the alkylated SiN surface, and in some embodiments, transforms the leaving group for the etch reaction from ammonia ($NH_3$) to alkylamines (e.g., $(Et)_2NH$). The polarization of the Si—N bonds is independent of the pH of the etch solution. This allows for the speciation of the etch solution to be independently controlled to favor the ions (e.g., F– ions) that drive the SiN etch, while reducing or preventing the formation of ions (e.g., HF or $HF_2^-$ ions) that drive the $SiO_2$ etch, thereby thermodynamically preventing the etch of $SiO_2$ and improving the selectivity of SiN.

Figure 5:
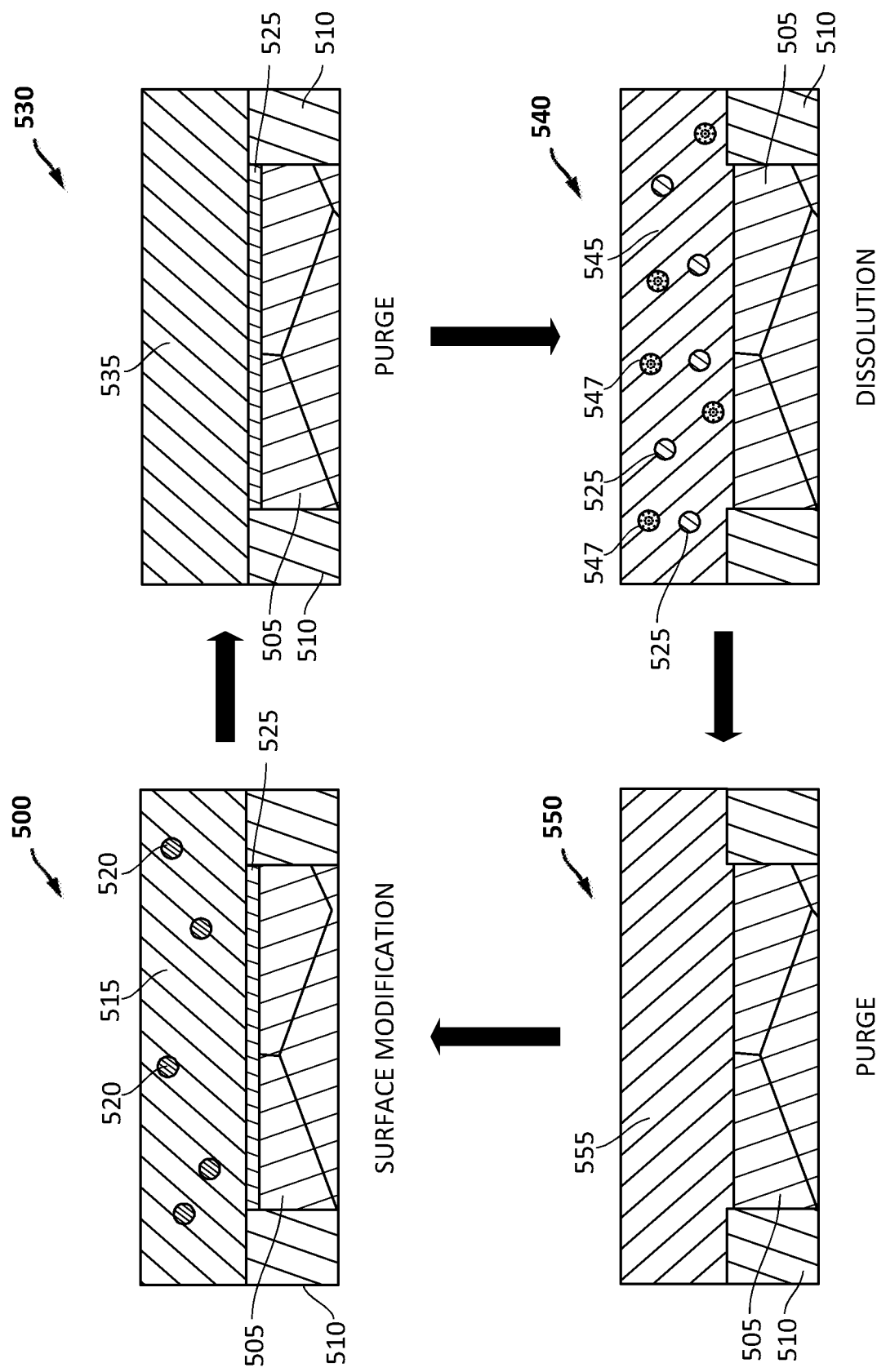
FIG. 5 is a process flow diagram of a cyclic, wet atomic layer etching (ALE) process that utilizes the techniques described herein to selectively etch silicon nitride over silicon oxide.
Figure 6:
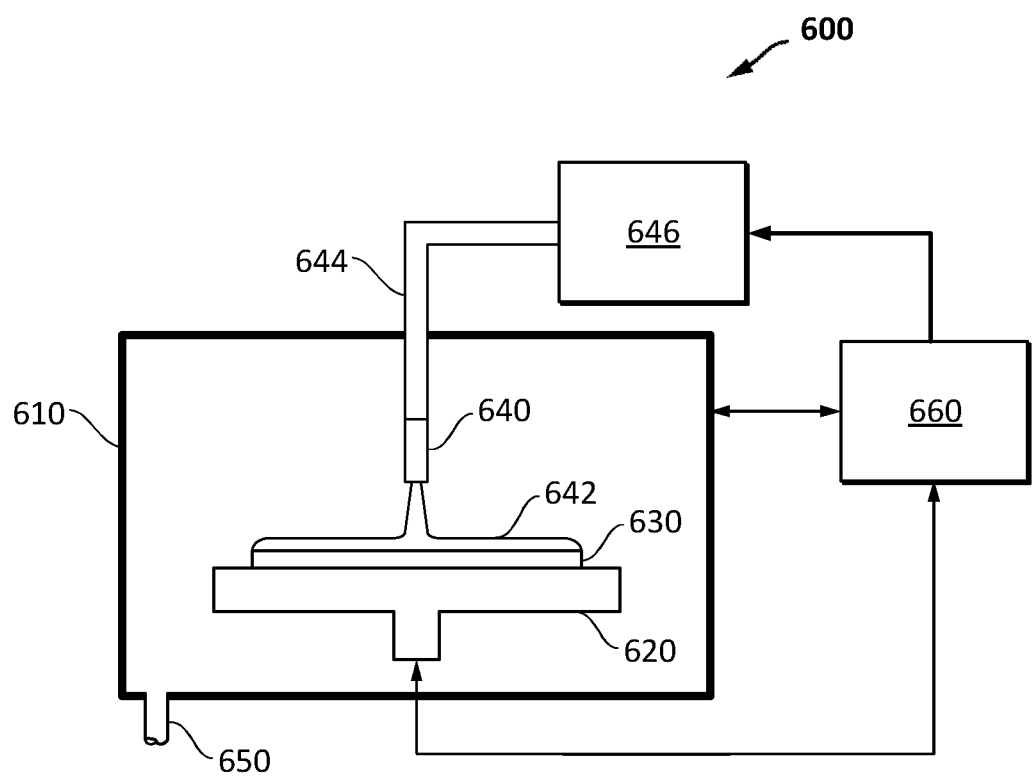
FIG. 6 is a block diagram of an example processing system that can use the techniques described herein to etch selectively etch silicon nitride over silicon oxide in a wet ALE process.

The processes and methods disclosed herein utilize a variety of new etch chemistries to achieve selective etching of silicon nitride over silicon oxide in both wet and dry etch processes. As described in more detail below, the new etch chemistries disclosed herein may be provided to the substrate in: (a) a solution phase during a wet atomic layer etching (ALE) process, or (b) a vapor phase during a chemical vapor etching (CVE) process. Example methods, process flows, and processing systems configured to perform the methods and process flows described herein are shown in FIGS. 4-6 (ALE) and FIGS. 7-9 (CVE).

Selective Etching of Silicon Nitride Using Wet Ale

Figure 4:
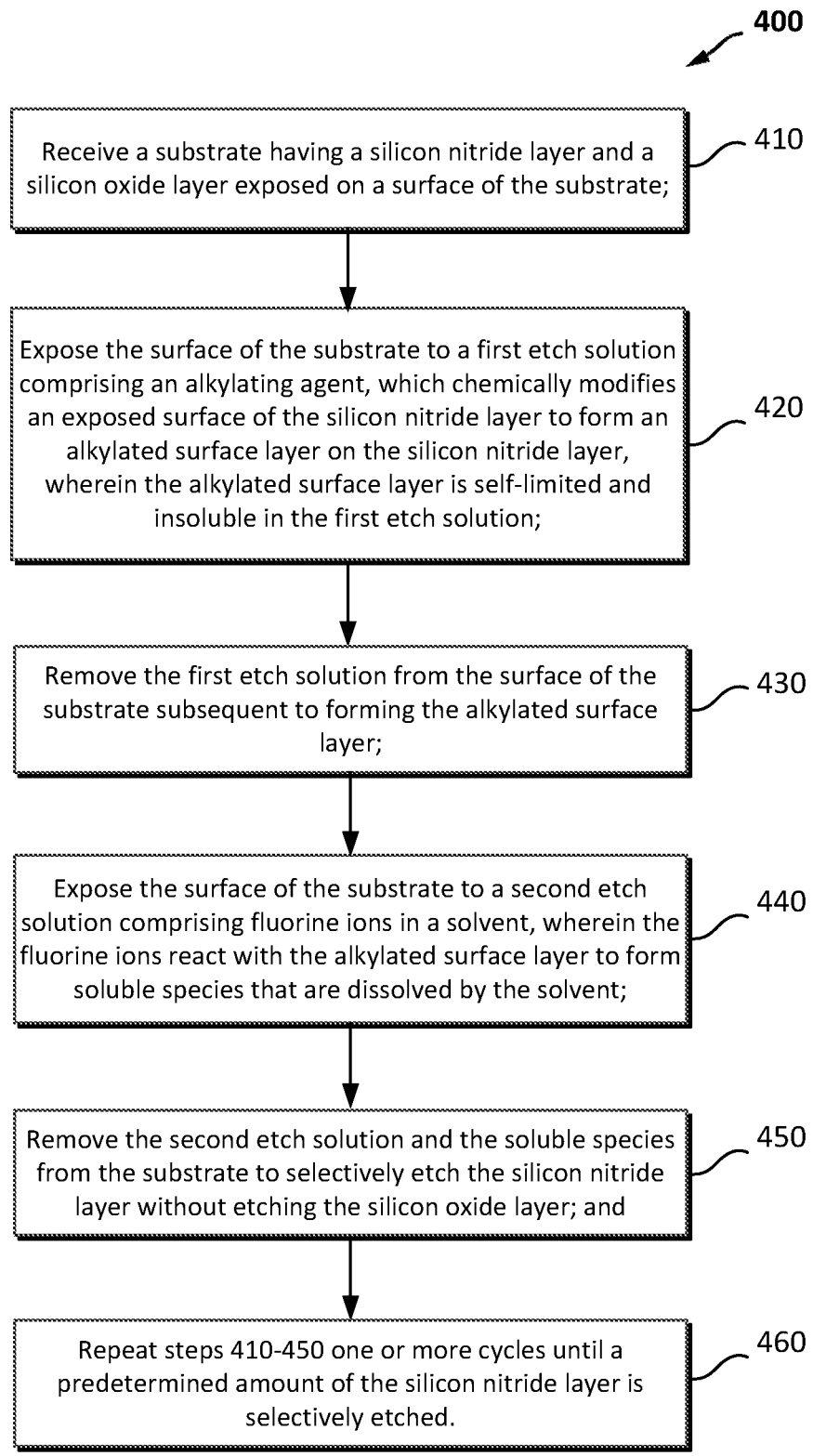
FIG. 4 is a flow chart diagram illustrating one embodiment of a method that utilizes the techniques described herein to selectively etch silicon nitride over silicon oxide.

FIG. 4 illustrates one embodiment of a method 400 that utilizes the techniques described herein to provide selective etching of silicon nitride over silicon oxide using a wet atomic layer etching (ALE) process. It will be recognized that the embodiment shown in FIG. 4 is merely exemplary and additional methods may utilize the techniques described herein. Further, additional processing steps may be added to the method shown in FIG. 4 as the steps described are not intended to be exclusive. Moreover, the order of the steps is not limited to the order shown in the figure as different orders may occur and/or various steps may be performed in combination or at the same time.

As shown in FIG. 4, the method 400 includes receiving a substrate having a silicon nitride layer and a silicon oxide layer exposed on a surface of the substrate (in step 410), and selectively etching the silicon nitride layer by performing multiple cycles of the wet ALE process, where each cycle of the wet ALE process includes: (a) exposing the surface of the substrate to a first etch solution comprising an alkylating agent, which chemically modifies an exposed surface of the silicon nitride layer to form an alkylated surface layer on the silicon nitride layer, wherein the alkylated surface layer is self-limited and insoluble in the first etch solution (in step 420); (b) removing the first etch solution from the surface of the substrate subsequent to forming the alkylated surface layer (in step 430); (c) exposing the surface of the substrate to a second etch solution comprising fluorine ions in a solvent, wherein the fluorine ions react with the alkylated surface layer to form soluble species that are dissolved by the solvent (in step 440); and (d) removing the second etch solution and the soluble species from the substrate to selectively etch the silicon nitride layer without etching the silicon oxide layer (in step 450). In some embodiments of the method 400, steps 410-450 may be repeated for one or more cycles until a predetermined amount of the silicon nitride layer is selectively etched (in step 460).

When the surface of the substrate is exposed to the first etch solution (in step 420), the alkylating agent reacts with amine groups on the exposed surface of the silicon nitride layer to: (a) increase polarization of silicon-nitrogen (Si—N) bonds on the exposed surface of the silicon nitride layer, (b) alkylate the amine surface groups to form the alkylated surface layer, and (c) increase a pKa value of the alkylated surface layer. As noted above, the amine surface groups (e.g., NH and/or $NH_2$ surface groups) may be formed on the silicon nitride surface as a result of the deposition process or surface treatment used to form the silicon nitride layer. A wide variety of alkylating agents may be used within the first etch solution. In some embodiments, the alkylating agent included within the first etch solution may be an alkyl halide (for example, a bromide, chloride or other halide of a hydrocarbon). In some embodiments, the alkyl halide may be ethyl bromide or methyl bromide. In one example embodiment, the first etch solution may be: (a) pure ethyl bromide, or (b) a dilute solution of ethyl bromide dissolved in water, alcohol or another organic solvent. It is noted, however, that the first etch solution is not strictly limited to ethyl bromide solutions and may include other alkyl halides in aqueous or non-aqueous solutions.

When the surface of the substrate is exposed to the second etch solution (in step 440), the Si—N bonds on the SiN surface are converted to Si—F bonds by replacing the alkylamine surface groups with F atoms. When the alkylamine surface groups are replaced with an F atoms, the Si atoms corresponding to those alkylamine surface groups are removed through additional fluorination to etch the SiN surface and expose the nitrogen (N) atoms on the underlying SiN surface. During the etch step, a rate limiting reaction occurs between the fluorine ions within the fluorinating agent and the alkylated surface layer. This rate limiting reaction occurs under conditions that are sufficient for removing the alkylated surface layer, but not the silicon oxide layer. The second etch solution may be an aqueous or non-aqueous solution. When an aqueous solution is used, the rate limiting reaction may occur at a pH, which is too high to etch the silicon oxide layer. When a non-aqueous solution is used, the speciation of fluoride may be controlled to prevent the formation of reactive species (e.g., $HF_2^-$ ions) that etch the silicon oxide layer. A wide variety of fluorinating agents may be used within the second etch solution. Regardless of the fluorinating agent used, the second etch solution is preferably one which: (a) preferentially reacts with alkylamine surface groups over amine groups on the silicon nitride layer, and (b) does not form reactive species capable of etching the silicon oxide layer.

In some embodiments, second etch solution may include a fluoride salt dissolved in a non-aqueous solvent. Examples of fluoride salts that may be included within the second etch solution include, but are not limited to, quaternary ammonium fluoride salts (such as, e.g., tetramethylammonium fluoride, benzyl trimethylammonium fluoride, etc.), quaternary phosphonium salts (such as, e.g., tetramethylphosphonium fluoride, tetraphenylphosphonium fluoride, etc.), heterocyclic fluoride salts (such as, e.g., 1,3-dimethylimidazolium fluoride, 1-methylpyridinium fluoride, etc.) and hexamethylenetetramine fluoride salts (such as, e.g., 1-methylhexamethylenetetramine fluoride, etc.). When a fluoride salt is used in the second etch solution, the fluoride salt provides the fluorine ions that react with the alkylated surface layer to form the soluble species that are dissolved by the non-aqueous solvent. The non-aqueous solvent may be, but is not limited to, dimethyl sulfoxide (($CH_3)_2SO$), dimethylformamide (($CH_3)_2NCH$), tetrahydrofuran (($CH_2)_4O$), acetonitrile ($CH_3CN$), an alcohol (such as, e.g., methanol, ethanol, IPA, etc.), a polyol (such as, e.g., glycerol, glycols), an ether (such as, e.g., diethyl ether) or a chlorocarbon (such as, e.g., dichloromethanes).

In other embodiments, the second etch solution may be a buffered HF solution comprising hydrofluoric acid (HF), a fluoride salt buffering agent such as ammonium fluoride ($NH_4F$) and a base dissolved in an aqueous solvent. The base may be a quaternary ammonium hydroxide (such as, e.g., ammonium hydroxide ($NH_4OH$), tetramethylammonium hydroxide (TMAH, $C_4H_{13}NO$)), a mineral base (such as, e.g., sodium hydroxide (NaOH)) or a trialkyl amine (such as, e.g., triethylamine). When the second etch solution includes HF, a buffering agent and a base, both HF and the buffering agent provide the fluorine ions that react with the alkylated surface layer to form the soluble species that are dissolved by the aqueous solvent. The base inhibits etching of the silicon oxide layer by increasing the overall pH of the second etch solution. In solution at low pH, HF partially dissociates to form ions including but not limited to $H^+$, $F^-$, and $HF_2^-$ in solution. The $HF_2^-$ ion is the species that is primarily responsible for etching silicon oxides. Its formation, as well as the etch of silicon oxides, is suppressed at high pH.

FIG. 5 illustrates one example of a wet ALE process that utilizes the techniques described herein to selectively etch silicon nitride over silicon oxide. More specifically, FIG. 5 illustrates exemplary steps performed during one cycle of a wet ALE process. In the process shown in FIG. 5, a substrate having a silicon nitride (SiN) layer 505 and a silicon oxide (e.g., $SiO_2$) layer 510 exposed on a surface of the substrate is brought in contact with a surface modification solution 515 during a surface modification step 500 to modify exposed surfaces of the SiN layer 505. The surface modification solution 515 contains an alkylating agent 520. For example, the surface modification solution 515 may include an alkyl halide, such as but not limited to ethyl bromide or methyl bromide.

As shown in FIG. 5, a chemical reaction occurs at the exposed surface of the SiN layer 505 to form a modified surface layer 525 (e.g., alkylated surface layer) in the surface modification step 500. In some cases, the chemical reaction to form the modified surface layer 525 may be fast and self-limiting. In other words, the reaction product may modify one or more monolayers of the exposed surface of the SiN layer 505, but may prevent any further reaction between the surface modification solution 515 and the underlying surface. By necessity, neither the SiN layer 505 to be etched nor the modified surface layer 525 can be soluble in the surface modification solution 515. In some cases, the surface modification step 500 shown in FIG. 5 may continue until the surface reaction is driven to saturation.

After the modified surface layer 525 is formed, the substrate may be rinsed with a first purge solution 535 to remove excess reactants from the surface of the substrate in a first purge step 530. The purge solution 535 should not react with the modified surface layer 525 or with the reagents present in the surface modification solution 515. In some embodiments, the first purge solution 535 used in the first purge step 530 may use the same solvent previously used in the surface modification step 500. In other embodiments, a different solvent may be used in the first purge solution 535. In some embodiments, the first purge step 530 may be long enough to completely remove all excess reactants from the substrate surface.

Once rinsed, a dissolution step 540 is performed to selectively remove the modified surface layer 525. In the dissolution step 540, the modified surface layer 525 is exposed to a dissolution solution 545 to selectively remove or dissolve the modified surface layer 525 without etching the unmodified SiN layer 505 underlying the modified surface layer 525 or etching the silicon oxide layer 510. The modified surface layer 525 must be soluble in the dissolution solution 545, while the unmodified SiN layer 505 underlying the modified surface layer 525 must be insoluble. The solubility of the modified surface layer 525 allows its removal through dissolution into the bulk dissolution solution 545. In some embodiments, the dissolution step 540 may continue until the modified surface layer 525 is completely dissolved.

The dissolution solution 545 contains a fluorinating agent 547 in a solvent. For example, the dissolution solution 545 may include a fluoride salt dissolved in a non-aqueous solvent, or a buffered HF solution comprising hydrofluoric acid (HF), a buffering fluoride salt and a base dissolved in an aqueous solvent. During the dissolution step 540, fluorine (F) ions within the fluorinating agent 547 react with the modified surface layer 525 to form soluble species that are dissolved by the aqueous or non-aqueous solvent.

Once the modified surface layer 525 is dissolved, the ALE etch cycle shown in FIG. 5 may be completed by performing a second purge step 550. The second purge step 550 may be performed by rinsing the surface of the substrate with a second purge solution 555, which may be the same or different than the first purge solution 535. In some embodiments, the second purge solution 555 may use the same solvent, which was used in the dissolution solution 545. The second purge step 550 may generally continue until the dissolution solution 545 and/or the reactants contained with the dissolution solution 545 are completely removed from the surface of the substrate.

As described above, the cyclic wet ALE process shown in FIG. 5 includes: a) a surface modification step 500 to chemically modify exposed surfaces of a SiN layer 505 by exposing the exposed surfaces of the SiN layer 505 to surface modification solution 515 to form a modified surface layer 525 (e.g., alkylated surface layer); b) a first purge step 530 to rinse the substrate with a first purge solution 535 to remove excess reactants from the surface; c) a dissolution step 540 to selectively remove or dissolve the modified surface layer 525 by exposing the modified surface layer to a dissolution solution 545 to selectively remove the modified surface layer 525; and d) a second purge step 550 to rinse the substrate with a second purge solution 555 and displace the dissolution solution 545 from the surface of the substrate. In some embodiments, the steps a)-d) may be repeated for one or more ALE cycles, until a desired amount of the SiN layer 505 has been removed. It is recognized that the cyclic wet ALE process shown in FIG. 5 is merely one example of an etch process that may be used to selectively etch a SiN layer 505 in the presence of a silicon oxide (e.g., $SiO_2$) layer 510.

The present disclosure contemplates a wide variety of etch chemistries that may be used in the surface modification solution 515 and the dissolution solution 545 when selectively etching silicon nitride using the wet ALE process shown in FIG. 5. Example etch chemistries are discussed in more detail below. Mixing of these solutions can lead to a continuous etch of the SiN layer 505. Thus, purge steps 530 and 550 are performed in the wet ALE process shown in FIG. 5 to prevent direct contact between the surface modification solution 515 and the dissolution solution 545 on the substrate surface.

In one embodiment, the substrate may be exposed to a surface modification solution 515 including ethyl bromide (EtBr, $CH_3CH_2Br$). Ethyl bromide is high vapor pressure liquid at room temperature. As noted above in reference to FIGS. 3A, 3B and 4, ethyl bromide reacts with amine surface groups (such as, e.g., $NH_2$) on the exposed SiN surface to polarize the Si—N bonds and form alkylamine groups on the SiN surface, thus forming a self-limiting alkylated surface layer on the SiN surface, which is insoluble in the surface modification solution 515. The reaction between ethyl bromide and the amine surface groups may lead to the formation of one or more alkylamine groups on the SiN surface including, for example, silyl-ethyl amine (Si-EtNH) groups, silyl-diethyl amine (Si-$(Et)_2$NH) groups and/or silyl-triethylammonium bromide salt (Si-$(Et)_3$NBr) groups. This reaction can be conducted in a solution of pure ethyl bromide, or a dilute solution of ethyl bromide dissolved in another solvent, such as water, alcohol (e.g., methanol, isopropanol, etc.) and most other organic solvents. Alternatively, other alkyl halides such as methyl bromide, or the bromide, chloride or any halide of any hydrocarbon can be used in the surface modification solution 515 to perform the surface alkylation needed to polarize the Si—N bonds and form the self-limiting alkylated surface layer.

The self-limiting alkylated surface layer formed during the surface modification step 500 must be removed every cycle after its formation. A second solution is used in the dissolution step 540 to selectively dissolve this modified surface layer. The dissolution step 540 may be performed using a variety of fluorine ($F^-$) ion-containing dissolution solutions 545.

In one embodiment, the substrate may be exposed to a dissolution solution 545 including a fluoride salt dissolved in a non-aqueous solvent. The fluoride salt included within the dissolution solution 545 may be a quaternary ammonium fluoride salt (such as, e.g., tetramethylammonium fluoride, benzyl trimethylammonium fluoride, etc.), a quaternary phosphonium salt (such as, e.g., tetramethylphosphonium fluoride, tetraphenylphosphonium fluoride, etc.), a heterocyclic fluoride salt (such as, e.g., 1,3-dimethylimidazolium fluoride, 1-methylpyridinium fluoride, etc.) or a hexamethylenetetramine fluoride salt (such as, e.g., 1-methylhexamethylenetetramine fluoride, etc.). The non-aqueous solvent may be dimethyl sulfoxide (($CH_3$)$_2$SO), dimethylformamide (($CH_3$)$_2$NCH), tetrahydrofuran (($CH_2$)$_4$O), acetonitrile ($CH_3CN$), an alcohol (such as, e.g., methanol, ethanol, IPA, etc.), a polyol (such as, e.g., glycerol, glycols), an ether (such as, e.g., diethyl ether) or a chlorocarbon (such as, e.g., dichloromethanes). When a fluoride salt is used in the dissolution solution 545, the fluoride salt provides the fluorine ions that react with the alkylated surface layer to form the soluble species that are dissolved by the non-aqueous solvent.

In another embodiment, the substrate may be exposed to a dissolution solution 545 including hydrofluoric acid (HF), a fluoride salt buffering agent (such as, e.g., ammonium fluoride ($NH_4F$)) and a base dissolved in an aqueous solvent. The base may be a quaternary ammonium hydroxide (such as, e.g., ammonium hydroxide ($NH_4OH$), tetramethylammonium hydroxide (TMAH, $C_4H_{13}NO$)), a mineral base (such as, e.g., sodium hydroxide (NaOH)) or a trialkyl amine (such as, e.g., triethylamine). When the dissolution solution 545 includes HF, a buffering agent and a base, both HF and the buffering agent provide the fluorine ions that react with the alkylated surface layer to form the soluble species that are dissolved by the aqueous solvent, and the base inhibits etching of the silicon oxide layer by increasing the overall pH of the second etch solution.

In the wet ALE process described above, the surface modification step (i.e., the alkylation reaction) is self-limiting and the dissolution step is selective to all other materials on the substrate, including the unmodified SiN layer. Self-limiting means that only a limited thickness of the SiN layer at the surface is modified or removed, regardless of how long a given etch solution is in contact with the SiN surface. Since the self-limiting alkylation reaction occurs only on the amine surface groups on the exposed SiN surface, the alkylation reaction is limited to one or more monolayers of reaction, or a partial monolayer of reaction.

The method 400 shown in FIG. 4 and the wet ALE process shown in FIG. 5 improves selectivity of silicon nitride over silicon oxide by using an alkylating agent (in step 420 of FIG. 4 and the surface modification step 500 of FIG. 5) to chemically react with the amine groups on the exposed SiN surface to polarize the S—N bonds and form alkylamine groups, which are easier to protonate. The alkylation reaction occurs only on the amine surface groups. In the absence of F ions to complete the etch reaction, alkylation of the amine surface groups leads to a self-limited alkylated surface layer, which is insoluble in the first etch solution (in FIG. 4) and the surface modification solution 515 (in FIG. 5). The alkylation reaction chemically modifies the exposed SiN surface in the surface modification step 500 of the wet ALE process shown in FIG. 5. ALE is a cyclic etch process where material is removed through the consecutive steps of self-limiting modified surface layer formation, followed by selective removal of the modified surface layer. After alkylation is used in the surface modification step 500, the alkylated surface layer is selectively removed by exposure to an $F^-$ ion containing solution (e.g., the second etch solution in FIG. 4 or the dissolution solution 545 in FIG. 5). The alkylation reaction polarizes the Si—N bonds to allow for $F^-$ ion attack under conditions (e.g., high pH) where $SiO_2$ is unreactive. The $F^-$ ion containing solution will selectively remove the alkylated surface layer as long as the solution does not contain chemistry that will polarize the Si—N bonds of the unmodified SiN layer underlying the alkylated surface layer. In some embodiments, the method 400 shown in FIG. 4 and the wet ALE process shown in FIG. 5 may selectively etch SiN over $SiO_2$ with an etch selectivity greater than 15:1. For example, the etch selectivity may be approximately 15:1, 30:1, 40:1 or more.

The method 400 shown in FIG. 4 and the wet ALE process shown in FIG. 5 described above can be accomplished using a variety of techniques. For example, the wet ALE process may be performed by dipping the substrate sample in beakers of each etch solution. In this case, purging can be accomplished by either rinsing or dipping the sample in an appropriate solvent bath. The wet ALE process can also be accomplished on a spinner. For example, the substrate sample may be rotated while the etchant solutions are dispensed from a nozzle positioned above the sample. The rotational motion of the sample distributes the solution over the surface. After the set exposure time, the nozzle begins dispensing the next solution in the etch recipe. This process continues through the whole etch cycle and repeats for as many cycles as necessary to remove the desired amount of metal. For high volume manufacturing, dispensing of etch solutions and rinses can be executed using conventional tools, such as wet etching tools and rinse tools.

The wet ALE process described above may be performed within a variety of semiconductor processing systems. While the wet ALE process can be accomplished using many different process chambers, tools and apparatuses, the processing equipment used to perform the wet ALE process is preferably capable of running at (or near) room temperature and at (or near) atmospheric pressure. In one example implementation, the wet ALE process described herein may be performed within a spin chamber. FIG. 6 illustrates one example of a processing system 600 that can use the techniques described herein to etch selectively etch silicon nitride over silicon oxide in a wet ALE process. It is noted, however, that the techniques described herein may be utilized with a wide range of processing systems, and the processing system 600 is simply one example embodiment.

As shown in FIG. 6, the processing system 600 includes a process chamber 610, which in some embodiments, may be a pressure controlled chamber. In the embodiment shown in FIG. 6, the process chamber 610 is a spin chamber having a spinner 620 (or spin chuck), which is configured to spin or rotate at a rotational speed. A substrate 630 is held on the spinner 620, for example, via electrostatic force or vacuum pressure. In one example, the substrate 630 may be a semiconductor wafer having a silicon nitride (SiN) layer and a silicon oxide (e.g., $SiO_2$) formed on or within the substrate 630.

The processing system 600 shown in FIG. 6 further includes a liquid nozzle 640, which is positioned over the substrate 630 for dispensing various etch solutions 642 onto a surface of the substrate 630. The etch solutions 642 dispensed onto the surface of the substrate 630 may generally include a first etch solution to chemically modify an exposed surface of the SiN layer to form an alkylated surface layer on the SiN layer, and a second etch solution to react with the alkylated surface layer to form soluble species that are dissolved to selectively remove the alkylated surface layer from the exposed SiN surface. Purge solutions may also be dispensed onto the surface of the substrate 630 between surface modification and dissolution steps to separate the first and second etch solutions. Examples of first etch solutions, second etch solutions and purge solutions are discussed above.

As shown in FIG. 6, the etch solutions 642 may be stored within a chemical supply system 646, which may include one or more reservoirs for holding the various etch solutions 642 and a chemical injection manifold, which is fluidly coupled to the process chamber 610 via a liquid supply line 644. In operation, the chemical supply system 646 may selectively apply desired chemicals to the process chamber 610 via the liquid supply line 644 and the liquid nozzle 640 positioned within the process chamber 610. Thus, the chemical supply system 646 can be used to dispense the etch solutions 642 onto the surface of the substrate 630. The process chamber 610 may further include a drain 650 for removing the etch solutions 642 from the process chamber 610.

Components of the processing system 600 can be coupled to, and controlled by, a controller 660, which in turn, can be coupled to a corresponding memory storage unit and user interface (not shown). Various processing operations can be executed via the user interface, and various processing recipes and operations can be stored in the memory storage unit. Accordingly, a given substrate 630 can be processed within the process chamber 610 in accordance with a particular recipe. In some embodiments, a given substrate 630 can be processed within the process chamber 610 in accordance with an etch recipe that utilizes the wet ALE techniques described herein for selectively etching silicon nitride.

The controller 660 shown in block diagram form in FIG. 6 can be implemented in a wide variety of manners. In one example, the controller 660 may be a computer. In another example, the controller 660 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a prescribed process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

As shown in FIG. 6, the controller 660 may be coupled to various components of the processing system 600 to receive inputs from, and provide outputs to, the components. For example, the controller 660 may be coupled to: the process chamber 610 for controlling the temperature and/or pressure within the process chamber 610; the spinner 620 for controlling the rotational speed of the spinner 620; and the chemical supply system 646 for controlling the various etch solutions 642 dispensed onto the substrate 630. The controller 660 may control other processing system components not shown in FIG. 6, as is known in the art.

In some embodiments, the controller 660 may control the various components of the processing system 600 in accordance with an etch recipe that utilizes the wet ALE techniques described herein for selectively etching silicon nitride (SiN). For example, the controller 660 may supply various control signals to the chemical supply system 646, which cause the chemical supply system 646 to: a) dispense a first etch solution onto the surface of the substrate 630 to chemically modify an exposed surface of the SiN layer to form an alkylated surface layer on the SiN layer; b) rinse the substrate 630 with a first purge solution to remove the first etch solution and excess reactants from the surface; c) dispense a second etch solution onto the surface of the substrate 630 to selectively remove or dissolve the alkylated surface layer; and d) rinse the substrate 630 with a second purge solution to remove the second etch solution from the surface of the substrate 630. In some embodiments, the controller 660 may supply the control signals to the chemical supply system 646 in a cyclic manner, such that the steps a)-d) are repeated for one or more ALE cycles, until a desired amount of the SiN layer is selectively etched.

The controller 660 may also supply control signals to other processing system components. In some embodiments, for example, the controller 660 may supply control signals to the spinner 620 and/or the chemical supply system 646 to dry the substrate 630 after the second purge step is performed. In one example, the controller 660 may control the rotational speed of the spinner 620, so as to dry the substrate 630 in a spin dry step. In another example, control signals supplied from the controller 660 to the chemical supply system 646 may cause a drying agent (such as, e.g., isopropyl alcohol) to be dispensed onto the surface of the substrate 630 to further assist in drying the substrate before performing the spin dry step.

In some embodiments, the controller 660 may control the temperature and/or the pressure within the process chamber 610. In some embodiments, the surface modification, dissolution and purge steps of the wet ALE process described herein may be performed at roughly the same temperature and pressure. In one example implementation, the surface modification, dissolution and purge steps may each be performed at (or near) atmospheric pressure and room temperature. Performing the processing steps within the same process chamber at roughly the same temperature and pressure decreases the cycle time and improves the throughput of the wet ALE process described herein by avoiding unnecessary chamber transitions and temperature/pressure changes.

Selective Etching of Silicon Nitride Using CVE

Figure 7:
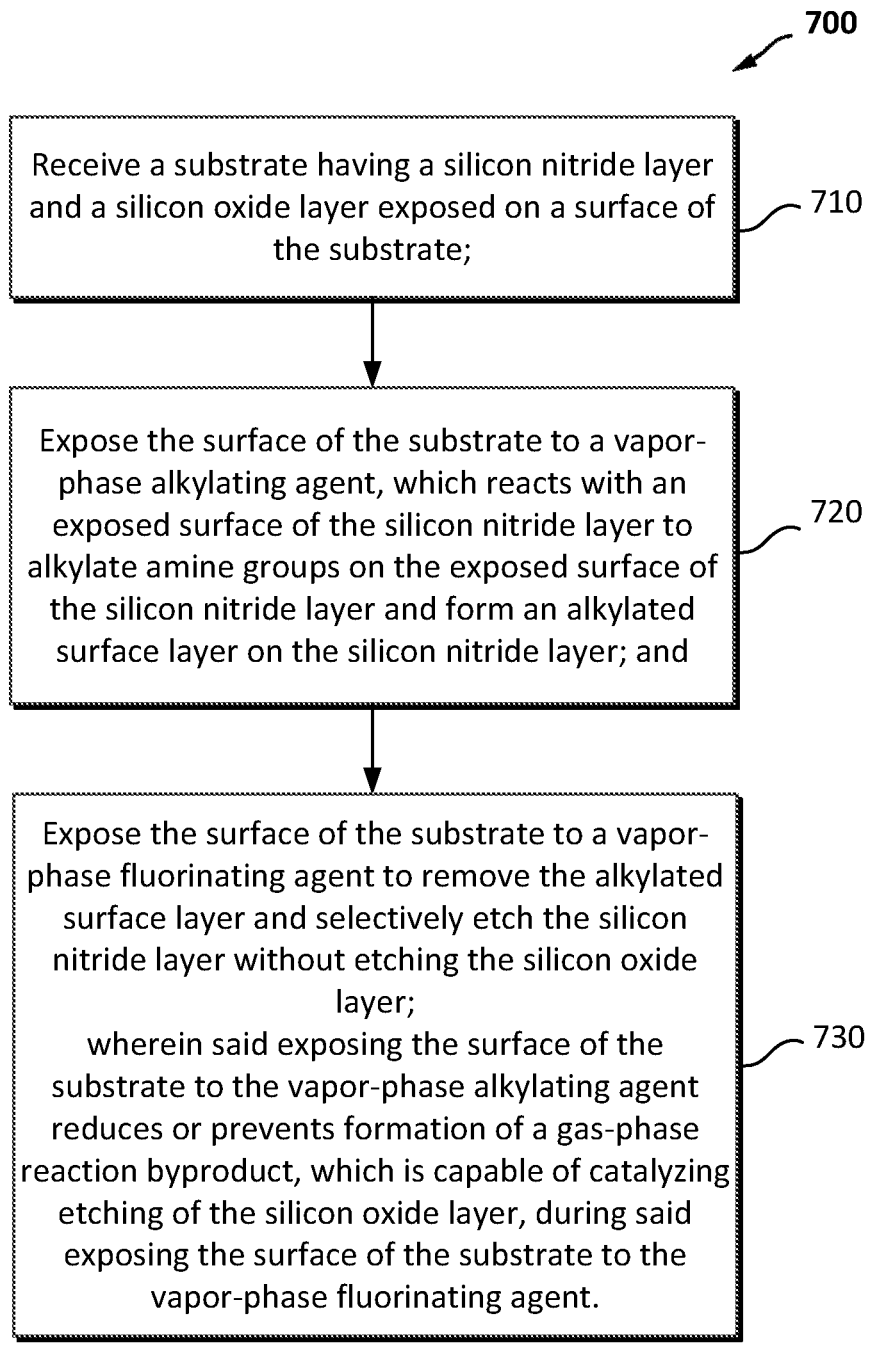
FIG. 7 is a flow chart diagram illustrating another embodiment of a method that utilizes the techniques described herein to selectively etch silicon nitride over silicon oxide.

FIG. 7 illustrates one embodiment of a method 700 that utilizes the techniques described herein to provide selective etching of silicon nitride over silicon oxide using a chemical vapor etching (CVE) process. It will be recognized that the embodiment shown in FIG. 7 is merely exemplary and additional methods may utilize the techniques described herein. Further, additional processing steps may be added to the method shown in FIG. 7 as the steps described are not intended to be exclusive. Moreover, the order of the steps is not limited to the order shown in the figure as different orders may occur and/or various steps may be performed in combination or at the same time.

The method 700 shown in FIG. 7 generally includes receiving a substrate having a silicon nitride layer and a silicon oxide layer exposed on a surface of the substrate (in step 710), exposing the surface of the substrate to a vapor-phase alkylating agent (in step 720) and exposing the surface of the substrate to a vapor-phase fluorinating agent (in step 730). The vapor-phase alkylating agent reacts with an exposed surface of the silicon nitride layer to alkylate the amine groups on the exposed surface of the silicon nitride layer and form an alkylated surface layer on the silicon nitride layer. The vapor-phase fluorinating agent removes the alkylated surface layer and selectively etches the silicon nitride layer without etching the silicon oxide layer. By exposing the surface of the substrate to the vapor-phase alkylating agent (in step 720) to convert the amine groups to alkylamine groups, the method 700 reduces or prevents formation of a gas-phase reaction byproduct (e.g., $NH_3$), which is capable of catalyzing etching of the silicon oxide layer, when the surface of the substrate is exposed to the vapor-phase fluorinating agent (in step 730).

A wide variety of vapor-phase alkylating agents and vapor-phase fluorinating agents may be used in the method 700 shown in FIG. 7. For example, the vapor-phase alkylating agent may be a first process gas containing an alkyl halide, such as an ethyl bromide or methyl bromide vapor, and the vapor-phase fluorinating agent may be a second process gas containing fluorine atoms. In one embodiment, the second process gas may comprise a hydrofluoric acid (HF) vapor; however, other types of process gases containing fluorine atoms reactive with the alkylated surface layer may also be used. For example, the second process gas may include difluoride ($F_2$), xenon difluoride ($XeF_2$) or nitrogen trifluoride ($NF_3$) in addition or alternative to HF.

In some embodiments of the method 700, the surface of the substrate may be exposed to the vapor-phase alkylating agent (in step 720) and the vapor-phase fluorinating agent (in step 730) sequentially with no overlap in time. In such embodiments, the surface of the substrate may be exposed to the vapor-phase alkylating agent to form alkylamine groups on the exposed surface of the silicon nitride layer. When the substrate is subsequently exposed to the vapor-phase fluorinating agent, fluorine atoms within the vapor-phase fluorinating agent react with the alkylamine groups to produce reaction byproducts, which are vaporized from the exposed surface of the silicon nitride layer to selectively remove the alkylated surface layer from the silicon nitride layer. The removal of the alkylated surface layer is non-limiting in this embodiment. As such, the surface of the substrate may be exposed to the vapor-phase fluorinating agent (in step 730) for an amount of time that is sufficient to remove the alkylated surface layer without: (a) etching the silicon nitride layer underlying the alkylated surface layer, or (b) forming a gas-phase reaction byproduct (e.g., $NH_3$) capable of catalyzing etching of the silicon oxide layer. In some embodiments, steps 720 and 730 may be repeated one or more times to repeatedly form and remove an alkylated surface layer on the silicon nitride layer to selectively etch a predetermined amount of the silicon nitride layer.

In other embodiments of the method 700, the surface of the substrate may be exposed to the vapor-phase alkylating agent (in step 720) and the vapor-phase fluorinating agent (in step 730) concurrently with at least some overlap in time. In such embodiments, the vapor-phase alkylating agent may react with the amine groups on the exposed surface of the silicon nitride layer to form alkylamine groups, and the vapor-phase fluorinating agent may react with the alkylamine groups to produce reaction byproducts, which are vaporized from the exposed surface of the silicon nitride layer to selectively remove the alkylated surface layer from the silicon nitride layer. The vapor-phase fluorinating agent may also react with the exposed surface of the silicon nitride layer to form at least some amount of a gas-phase reaction byproduct (e.g., $NH_3$), which is capable of catalyzing etching of the silicon oxide layer. In such embodiments, the vapor-phase alkylating agent may react with the gas-phase reaction byproduct of the fluorination reaction to form an alkyl amine (e.g., $Et_3N$) gas. This gas phase reaction reduces the concentration of the gas-phase reaction (e.g., $NH_3$) byproduct to prevent etching of the silicon oxide layer.

Figure 8A:
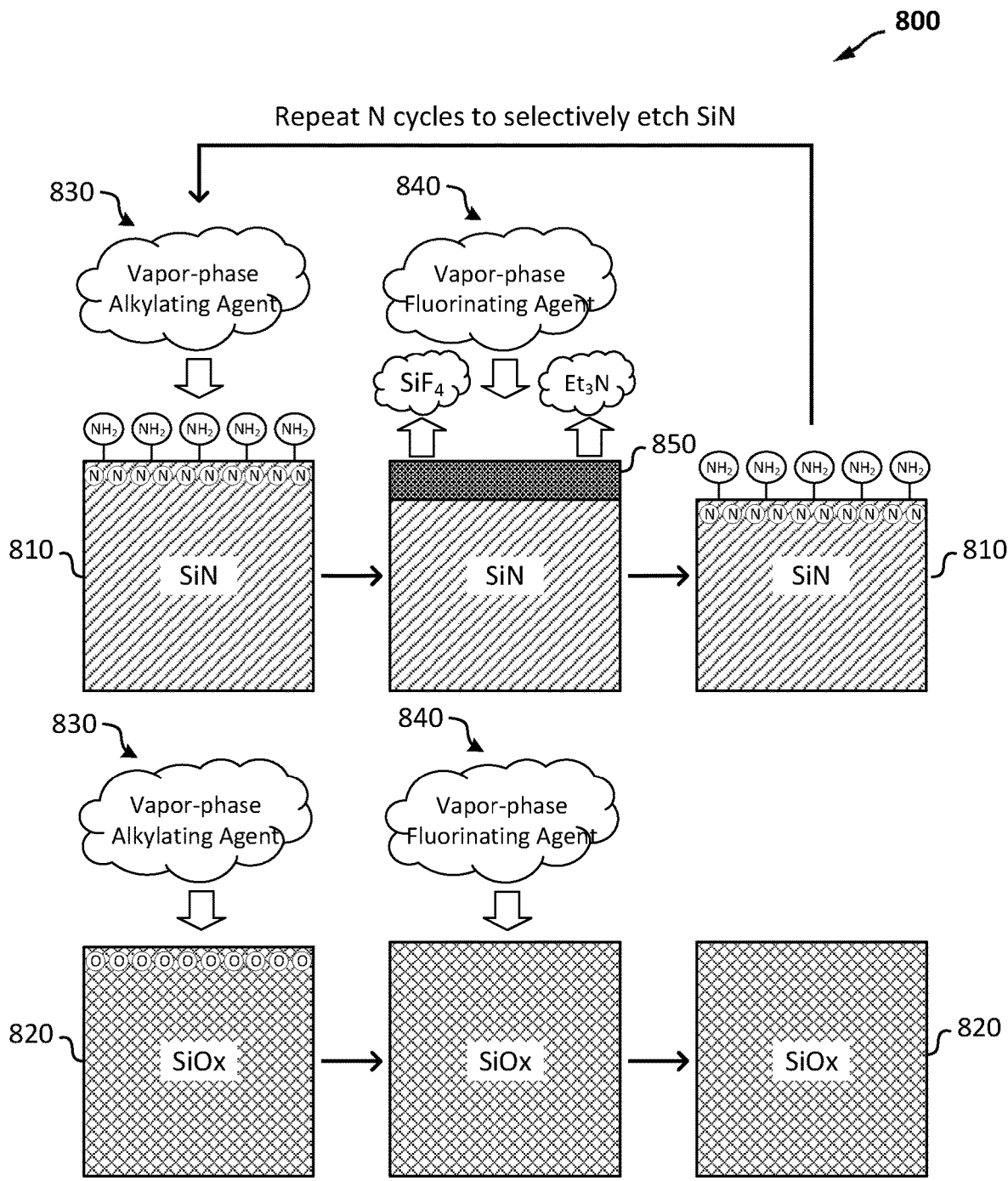
FIG. 8A is a process flow diagram of a chemical vapor etching (CVE) process that utilizes the techniques described herein to selectively etch silicon nitride over silicon oxide.
Figure 8B:
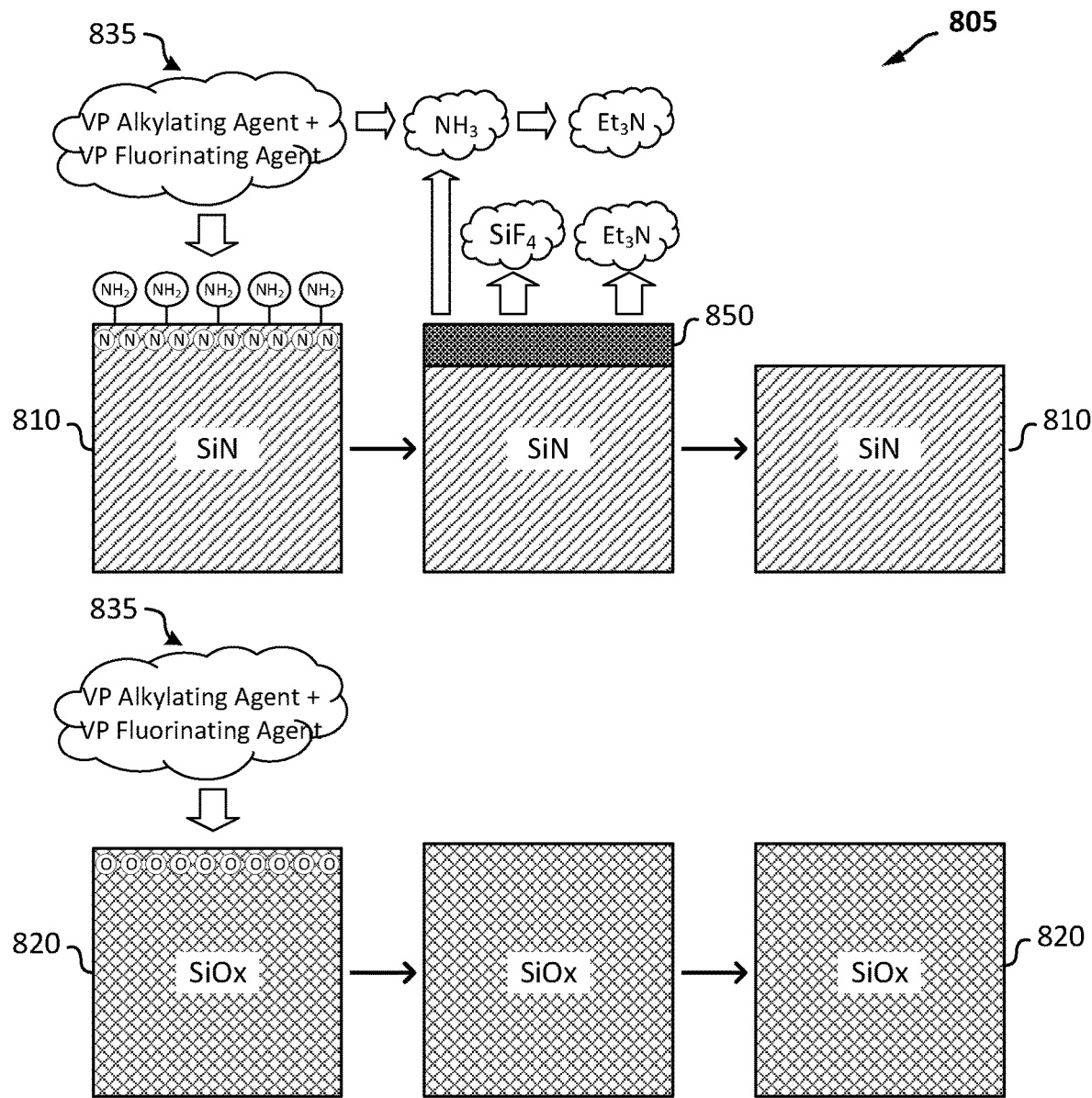
FIG. 8B is a process flow diagram of another CVE process that utilizes the techniques described herein to selectively etch silicon nitride over silicon oxide.

FIGS. 8A and 8B illustrate example chemical vapor etching (CVE) processes that utilize the techniques described herein to selectively etch silicon nitride over silicon oxide. Like the method 700 shown in FIG. 7, the CVE processes shown in FIGS. 8A and 8B expose the surface of the substrate to: (a) a vapor-phase alkylating agent, which reacts with the exposed SiN surface to alkylate the amine groups on the exposed SiN surface and form an alkylated surface layer on the silicon nitride layer, and (b) a vapor-phase fluorinating agent to remove the alkylated surface layer and selectively etch the silicon nitride layer without etching the silicon oxide layer. Examples of vapor-phase alkylating agents and vapor-phase fluorinating agents suitable for use within the CVE processes shown in FIGS. 8A and 8B are discussed briefly above.

In one embodiment, the vapor-phase alkylating agent may be an anhydrous ethyl bromide (EtBr) vapor and the vapor-phase fluorinating agent may be an anhydrous hydrofluoric acid (HF) vapor. As described in more detail below in reference to FIG. 9, the high vapor pressure of EtBr and HF allows facile dosing of these precursors in the gas-phase by flowing vapor from the headspace of a container containing the liquid (e.g., a pressurized container in the case of HF), or by bubbling an inert gas through the liquid. Vaporizers can also be used to create high flow rates of EtBr and HF vapor. HF dissolved in pyridine can also be used as an HF vapor source. Regardless of the delivery method utilized, the anhydrous EtBr vapor and HF vapor is preferably supplied to the surface of the substrate under process conditions, which prevent the vapor-phase precursors from reacting with the exposed silicon oxide surface. For example, the anhydrous EtBr vapor and HF vapor may be supplied to the surface of the substrate at a temperature (e.g., significantly less than 800° K) that prevents HF from reacting with the exposed silicon oxide surface.

FIG. 8A illustrates a CVE process 800 for selectively etching silicon nitride when the substrate is exposed to the vapor-phase alkylating agent and the vapor-phase fluorinating agent sequentially with no overlap in time. In the CVE process 800 shown in FIG. 8A, a substrate having a silicon nitride (SiN) layer 810 and a silicon oxide (e.g., $SiO_2$) layer 820 exposed on a surface of the substrate is exposed to first process gas 830 comprising a vapor-phase alkylating agent (e.g., anhydrous EtBr vapor) before the substrate is subsequently exposed to a second process gas 840 comprising a vapor-phase fluorinating agent (e.g., anhydrous HF vapor).

When the substrate is exposed to the first process gas 830, the vapor-phase alkylating agent reacts with the amine groups on the exposed surfaces of the SiN layer 810 to polarize the Si—N bonds and form alkylamine groups on the SiN surface, thus forming an alkylated surface layer 850 on the SiN surface. As noted above, amine surface groups (e.g., NH and/or $NH_2$ surface groups) may be formed on the silicon nitride surface as a result of the deposition process or surface treatment used to form the SiN layer 810. Although $NH_2$ surface groups are depicted in FIG. 8A, other amine surface groups may also be formed on the SiN surface. When the first process gas 830 includes ethyl bromine (EtBr), the reaction between the EtBr vapor and the amine groups on the SiN surface converts the amine surface groups (e.g., $NH_2$) on the SiN surface to alkylamine groups (e.g., Si-EtNH groups, Si-$(Et)_2$NH groups and/or Si-$(Et)_3$NBr groups). As noted above, the alkylated surface layer 850 may include a mix of one or more alkylamine surface groups. As further shown in FIG. 8A, the anhydrous EtBr vapor does not react with the exposed surfaces of the silicon oxide layer 820 or produce gas-phase reaction byproducts (such as, e.g., $H_2O$) capable of catalyzing the etch of the silicon oxide layer 820.

When the substrate is subsequently exposed to the second process gas 840, a chemical reaction occurs between the alkylamine groups on the SiN surface and the fluorine atoms in the vapor-phase fluorinating agent to produce reaction byproducts, which are vaporized from the SiN surface to selectively remove the alkylated surface layer 850 from the underlying silicon nitride layer 810. When the second process gas 840 includes hydrofluoric acid (HF), the reaction between the HF vapor and the alkylamine groups on the SiN surface produces silicon tetrafluoride ($SiF_4$) and triethylamine ($Et_3N$) gas-phase reaction byproducts, which are vaporized from the SiN surface to remove the alkylated surface layer 850, as shown in FIG. 8A. As further shown in FIG. 8A, the anhydrous HF vapor does not react with the exposed surfaces of the silicon oxide layer 820 under the process conditions utilized or produce gas-phase reaction byproducts (such as, e.g., $H_2O$) capable of catalyzing the etch of the silicon oxide layer 820.

The reaction between the HF vapor and the alkylamine groups on the SiN surface is not self-limiting. As such, the HF exposure time must be limited (e.g., timed) to ensure selective removal of the alkylated surface layer 850 without etching the underlying SiN layer 810 or generating gas-phase reaction byproducts (e.g., $NH_3$) capable of catalyzing the etch of the silicon oxide layer 820. In some embodiments, the CVE process 800 shown in FIG. 8A may alternately expose the substrate to the first process gas 830 and the second process gas 840 one or more times to repeatedly form and remove an alkylated surface layer 850 on/from the silicon nitride layer 810 to selectively etch a predetermined amount of the silicon nitride layer 810. When the substrate is exposed to the second process gas 840 to remove the alkylated surface layer 850, nitrogen (N) atoms underlying the alkylated surface layer 850 are exposed to leftover hydrogen (H) atoms in the second process gas 840. The H atoms bind with the newly exposed nitrogen atoms to form new amine surface groups (e.g., $NH_2$) on the SiN surface, as shown in FIG. 8A. This can occur by either a stepwise or concerted mechanism.

FIG. 8B illustrates another CVE process 805 for selectively etching silicon nitride when the substrate is exposed to the vapor-phase alkylating agent and the vapor-phase fluorinating agent concurrently with at least some overlap in time. In the CVE process 805 shown in FIG. 8B, a substrate having a silicon nitride (SiN) layer 810 and a silicon oxide (e.g., $SiO_2$) layer 820 exposed on a surface of the substrate is exposed to a combined process gas 835 comprising a vapor-phase alkylating agent (e.g., anhydrous EtBr vapor) and a vapor-phase fluorinating agent (e.g., anhydrous HF vapor).

When the substrate is exposed to the combined process gas 835, the vapor-phase alkylating agent reacts with the amine groups (e.g., $NH_2$) on the exposed surfaces of the SiN layer 810 to polarize the Si—N bonds and form alkylamine groups (i.e., an alkylated surface layer 850) on the SiN surface, which are selectively removed by the vapor-phase fluorinating agent. When the combined process gas 835 includes a mixture of anhydrous EtBr and HF vapor, for example, the EtBr vapor may react with the amine surface groups to produce a mix of alkylamine surface groups, as discussed above in reference to FIG. 8A. Like the previous embodiment shown in FIG. 8A, the HF vapor included within the combined process gas 835 may react with the alkylamine groups on the SiN surface to produce silicon tetrafluoride ($SiF_4$) and triethylamine ($Et_3N$) gas-phase reaction byproducts, which are vaporized from the SiN surface to selectively remove the alkylated surface layer 850, as shown in FIG. 8B. Unlike the previous embodiment shown in FIG. 8A, however, the HF vapor may also react with the exposed SiN surface to produce a gas-phase reaction byproduct (e.g., $NH_3$), which is capable of catalyzing the etch of the silicon oxide layer 820. When this occurs, the EtBr vapor included within the combined process gas 835 may react with the $NH_3$ gas byproduct to form, for example, triethylamine ($Et_3N$) gas. This gas phase reaction reduces the concentration of the $NH_3$ gas in the process chamber to prevent the $NH_3$ gas from reacting with and etching of the silicon oxide layer 820.

The method 700 shown in FIG. 7 and the CVE processes shown in FIGS. 8A and 8B improve selectivity of silicon nitride (SiN) over silicon oxide (e.g., $SiO_2$) by exposing the substrate to one or more process gases comprising vapor-phase alkylating and fluorinating agents. For example, HF vapor is known to provide good selectivity for etching SiN over $SiO_2$ until $NH_3$ reaction byproducts start to catalyze the etch of $SiO_2$. The chemical vapor etching (CVE) embodiments depicted in FIGS. 8A and 8B show that SiN can be selectively etched either by alternate exposure (FIG. 8A) or simultaneous exposure (FIG. 8B) to ethyl bromide (EtBr) and hydrofluoric acid (HF) vapor.

In the case of alternate exposures (FIG. 8A), ethyl bromide reacts with the SiN surface to alkylate the amine surface groups and form an alkylated surface layer 850. The HF exposure is then timed so that the alkylated surface layer 850 is etched, but the underlying silicon nitride layer 810 is not. This prevents the formation of $NH_3$ as a reaction byproduct.

In the case of simultaneous exposure (FIG. 8B), ethyl bromide and HF are dosed together. Ethyl bromide reacts with the SiN surface to alkylate the amine surface groups and form an alkylated surface layer 850, which is easier to etch with HF. As such, the formation of alkyl amines is favored over $NH_3$ in the CVE process 805 shown in FIG. 8B. Since ethyl bromide and HF are dosed together in FIG. 8B, ethyl bromide can react with $NH_3$ in the gas-phase to form alkyl amine gases, such as triethylamine ($Et_3N$) gas. This is another pathway by which the $NH_3$ concentration in the process chamber can be minimized.

In either case, alkylation during CVE shifts the reaction byproducts from ammonia ($NH_3$) to alkyl amines (such as, $Et_3N$), which are less active for the catalysis of $SiO_2$. Thus, alkylation of the SiN surface improves the etch selectivity of silicon nitride. In some embodiments, the method 700 shown in FIG. 7 and the CVE processes shown in FIGS. 8A and 8B may achieve an etch selectivity of SiN to $SiO_2$ that is greater than 15:1. For example, the etch selectivity may be approximately 15:1, 30:1, 40:1 or more.

The method 700 shown in FIG. 7 and the CVE processes shown in FIGS. 8A and 8B described above can be accomplished using a variety of techniques. For example, the CVE processes shown in FIGS. 8A and 8B may be performed by flowing EtBr vapor and HF vapor from the headspace of a container containing the liquids (e.g., a pressurized container in the case of HF), or by bubbling an inert gas through the liquids. Vaporizers can also be used to create high flow rates of EtBr and HF vapor, or HF can be dissolved in pyridine to provide an HF vapor source. In some embodiments, the CVE processes may be performed within a processing system, such as but not limited to the processing system shown in FIG. 9.

Figure 9:
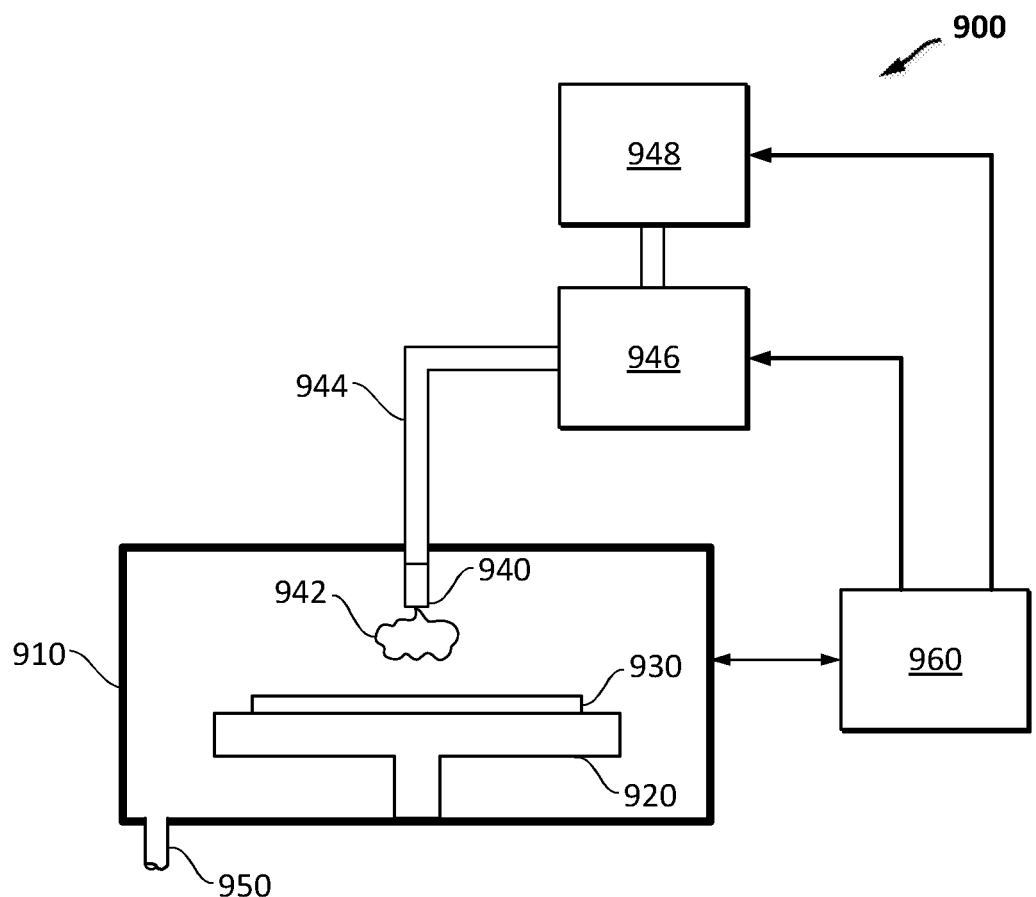
FIG. 9 is a block diagram of an example processing system that can use the techniques described herein to etch selectively etch silicon nitride over silicon oxide in a CVE process.

FIG. 9 illustrates one example of a processing system 900 that can use the techniques described herein to etch selectively etch silicon nitride over silicon oxide in a CVE process. It is noted, however, that the techniques described herein may be utilized with a wide range of processing systems, and the processing system 900 is simply one example embodiment.

As shown in FIG. 9, the processing system 900 includes a process chamber 910, which in some embodiments, may be a pressure controlled chamber. A substrate 930 is held on a support surface 920, for example, via electrostatic force or vacuum pressure. In one example, the substrate 930 may be a semiconductor wafer having a silicon nitride (SiN) layer and a silicon oxide (e.g., $SiO_2$) layer formed on or within the substrate 630.

The processing system 900 shown in FIG. 9 further includes a gas nozzle 940, which is positioned over the substrate 930 for dispensing various process gases 942 into the process chamber 910. The process gases 942 may generally include a vapor-phase alkylating agent, which reacts with an exposed surface of the SiN layer to alkylate the amine surface groups and form an alkylated surface layer on the SiN layer, and a vapor-phase fluorinating agent to remove the alkylated surface layer and selectively etch the SiN layer without etching the silicon oxide layer. Examples of process gases containing vapor-phase alkylating agents and vapor-phase fluorinating agents are discussed above.

As shown in FIG. 9, the processing system 900 may further include a chemical supply system 946, which may include one or more reservoirs for holding the various processing liquids, and a vapor supply system 948, which can be used to flow vapor from the headspace of the reservoirs containing the processing liquids or bubble an inert gas through the processing liquids. The chemical supply system 946 and/or the vapor supply system 948 may be fluidly coupled to the process chamber 910 via a gas supply line 944. In operation, the chemical supply system 946 may selectively apply desired process gases 942 to the process chamber 910 via the gas supply line 944 and the gas nozzle 940 positioned within the process chamber 910. Thus, the chemical supply system 946 can be used to dispense the process gases 942 within the process chamber 910. The process chamber 910 may further include a gas exhaust 950 for removing the process gases 942 and reaction byproducts from the process chamber 910.

Components of the processing system 900 can be coupled to, and controlled by, a controller 960, which in turn, can be coupled to a corresponding memory storage unit and user interface (not shown). Various processing operations can be executed via the user interface, and various processing recipes and operations can be stored in the memory storage unit. Accordingly, a given substrate 930 can be processed within the process chamber 910 in accordance with a particular recipe. In some embodiments, a given substrate 930 can be processed within the process chamber 910 in accordance with an etch recipe that utilizes the chemical vapor etching (CVE) techniques described herein for selectively etching silicon nitride.

The controller 960 shown in block diagram form in FIG. 9 can be implemented in a wide variety of manners. In one example, the controller 960 may be a computer. In another example, the controller 960 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a prescribed process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

As shown in FIG. 9, the controller 960 may be coupled to various components of the processing system 900 to receive inputs from, and provide outputs to, the components. For example, the controller 960 may be coupled to: the process chamber 910 for controlling the temperature and/or pressure within the process chamber 910, and the chemical supply system 946 and/or the vapor supply system 948 for controlling the various process gases 942 supplied to the process chamber 910. The controller 960 may control other processing system components not shown in FIG. 9, as is known in the art.

In some embodiments, the controller 960 may control the various components of the processing system 900 in accordance with an etch recipe that utilizes the CVE techniques described herein for selectively etching silicon nitride (SiN). For example, the controller 960 may supply various control signals to the chemical supply system 946 and/or the vapor supply system 948, which cause the chemical supply system 946 and/or the vapor supply system 948 to dispense at least one process gas 942 comprising a vapor-phase alkylating agent and a vapor-phase fluorinating agent into the process chamber 910. In some embodiments, the controller 960 may supply the control signals to the chemical supply system 946 and/or the vapor supply system 948 to dispense a first process gas comprising a vapor-phase alkylating agent and a second process gas comprising a vapor-phase fluorinating agent into the process chamber 910, where the first and second process gases are dispensed sequentially with no overlap in time. In other embodiments, the controller 960 may supply the control signals to the chemical supply system 946 and/or the vapor supply system 948 to dispense the vapor-phase alkylating agent and the vapor-phase fluorinating agent into the process chamber 910 concurrently within at least some overlap in time. In some embodiments, the vapor-phase alkylating and fluorinating agents may be combined within a single process gas 942 dispensed by the gas nozzle 940. Alternatively, additional gas nozzle(s) may be added to the processing system 900 to concurrently dispense a first process gas comprising a vapor-phase alkylating agent and a second process gas comprising a vapor-phase fluorinating agent into the process chamber 910.

The controller 960 may also supply control signals to other processing system components. For example, the controller 960 may control the temperature and/or the pressure within the process chamber 910. In some embodiments, the temperature within the process chamber 910 may set low enough to prevent the vapor-phase fluorinating agent from reacting with the silicon oxide surface. For example, the temperature within the process chamber 910 may be substantially less than 800° K.

Improved processes and methods are described above for selectively etching silicon nitride layers over oxide layers formed on a substrate. It is noted that one or more deposition processes can be used to form the silicon nitride and silicon oxide layers described herein, as is well known to those skilled in the art. For example, one or more depositions can be implemented using chemical vapor deposition (CVD), plasma enhanced CVD (PECVD), physical vapor deposition (PVD), atomic layer deposition (ALD), and/or other deposition processes utilizing any of a wide-ranging deposition. Lithography processes with respect to photoresist (PR) layers can be implemented using optical lithography, extreme ultra-violet (EUV) lithography, and/or other lithography processes.

The etch processes utilized to selectively etch silicon nitride over silicon oxide can be implemented using various wet ALE and CVE processes. For example, wet ALE processes can be implemented using surface modification solutions comprising alkylating agents and dissolution solutions comprising fluorinating agents. Likewise, CVE processes can be implemented using process gases containing alky halides and process gases containing fluorine atoms. Operating variables for the various process steps described herein can be controlled to ensure that desired etch parameters are achieved. The operating variables may include, for example, the chamber temperature, chamber pressure, spin chuck rotational speed, liquids, liquid flow rates, gases, gas flow rates, and/or other operating variables for the processing steps. Variations can also be implemented while still taking advantage of the techniques described herein.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of selectively etching silicon nitride over silicon oxide using a wet atomic layer etching (ALE) process, the method comprising:

receiving a substrate having a silicon nitride layer and a silicon oxide layer exposed on a surface of the substrate;

selectively etching the silicon nitride layer by performing multiple cycles of the wet ALE process, wherein each cycle comprises:

exposing the surface of the substrate to a first etch solution comprising an alkylating agent, which chemically modifies an exposed surface of the silicon nitride layer to form an alkylated surface layer on the silicon nitride layer, wherein the alkylated surface layer is self-limited and insoluble in the first etch solution;

removing the first etch solution from the surface of the substrate subsequent to forming the alkylated surface layer;

exposing the surface of the substrate to a second etch solution comprising fluorine ions in a solvent, wherein the fluorine ions react with the alkylated surface layer to form soluble species that are dissolved by the solvent; and removing the second etch solution and the soluble species from the substrate to selectively etch the silicon nitride layer without etching the silicon oxide layer.

2. The method of claim 1, further comprising repeating said exposing the surface of the substrate to the first etch solution, said removing the first etch solution, said exposing the surface of the substrate to the second etch solution, and said removing the etch solution one or more cycles until a predetermined amount of the silicon nitride layer is selectively etched.

3. The method of claim 1, wherein an etch selectivity of the silicon nitride layer to the silicon oxide layer is greater than 15:1.

4. The method of claim 1, wherein during said exposing the surface of the substrate to the first etch solution, the alkylating agent reacts with amine groups on the exposed surface of the silicon nitride layer to form alkylamine groups on the exposed surface of the silicon nitride layer, wherein the alkylated surface layer comprises the alkylamine groups.

5. The method of claim 4, wherein during said exposing the surface of the substrate to the second etch solution, a rate limiting etch reaction occurs between the fluorine ions and the alkylated surface layer, and wherein the rate limiting etch reaction occurs under conditions that etch the alkylated surface layer, but not the silicon oxide layer.

6. The method of claim 4, wherein the second etch solution preferentially reacts with the alkylamine groups over the amine groups on the silicon nitride layer, and wherein the second etch solution does not form reactive species capable of etching the silicon oxide layer.

7. The method of claim 1, wherein the alkylating agent included within the first etch solution is an alkyl halide.

8. The method of claim 7, wherein the alkyl halide is a bromide, chloride or other halide of a hydrocarbon.

9. The method of claim 7, wherein the alkyl halide is ethyl bromide or methyl bromide.

10. The method of claim 1, wherein the first etch solution comprises: (a) pure ethyl bromide, or (b) a dilute solution of ethyl bromide dissolved in water, alcohol or another organic solvent.

11. The method of claim 1, wherein the second etch solution comprises a fluoride salt dissolved in a non-aqueous solvent, wherein the fluoride salt provides the fluorine ions that react with the alkylated surface layer to form the soluble species that are dissolved by the non-aqueous solvent.

12. The method of claim 11, wherein the fluoride salt is a quaternary ammonium fluoride salt, a quaternary phosphonium salt, a heterocyclic fluoride salt or a hexamethylenetetramine fluoride salt, and wherein the non-aqueous solvent is dimethyl sulfoxide (($CH_3$)$_2$SO), dimethylformamide (($CH_3$)$_2$NCH), tetrahydrofuran (($CH_2$)$_4$O), acetonitrile ($CH_3$CN), an alcohol, a polyol, an ether or a chlorocarbon.

13. The method of claim 1, wherein the second etch solution is a buffered HF solution comprising hydrofluoric acid (HF), a fluoride salt buffering agent and a base dissolved in an aqueous solvent, wherein the hydrofluoric acid and the fluoride salt buffering agent provide the fluorine ions that react with the alkylated surface layer to form the soluble species that are dissolved by the aqueous solvent, and wherein the base inhibits etching of the silicon oxide layer by increasing a pH of the second etch solution.

14. The method of claim 13, wherein the base is a quaternary ammonium hydroxide, a mineral base or a trialkyl amine.

* * * * *